United States Patent
Kishi

(10) Patent No.: US 7,583,943 B2
(45) Date of Patent: Sep. 1, 2009

(54) AUTOMATIC GAIN CONTROL DEVICE

(75) Inventor: Takahiko Kishi, Yokohama (JP)

(73) Assignee: Samsung Electronics Co., Ltd (KR)

( * ) Notice: Subject to any disclaimer, the term of this patent is extended or adjusted under 35 U.S.C. 154(b) by 566 days.

(21) Appl. No.: 11/169,120

(22) Filed: Jun. 28, 2005

(65) Prior Publication Data
US 2006/0009181 A1    Jan. 12, 2006

(30) Foreign Application Priority Data
Jun. 28, 2004    (JP)    ............... 2004-189326

(51) Int. Cl.
H04B 1/06    (2006.01)
H04B 7/00    (2006.01)

(52) U.S. Cl. .............. 455/234.2; 455/240.1; 455/242.2; 455/244.1

(58) Field of Classification Search .............. 455/232.1, 455/233.1, 234.1, 234.2, 235.1, 239.1, 240.1, 455/241.1, 242.1, 242.2, 243.1, 244.1, 246.1, 455/247.1, 253.2
See application file for complete search history.

(56) References Cited

U.S. PATENT DOCUMENTS
7,113,758 B2 *  9/2006  Kishi ................ 455/234.1

FOREIGN PATENT DOCUMENTS
JP    05-327540    10/1993
JP    09-064672    7/1997

* cited by examiner

*Primary Examiner*—Edward Urban
*Assistant Examiner*—Christian A Hannon
(74) *Attorney, Agent, or Firm*—The Farrell Law Firm, LLP

(57) ABSTRACT

An automatic gain control device capable of reducing signal saturation or signal distortion caused by out-of-band signals of a filter or delay of a control signal. An AGC response control section compares a level of control voltage ('V2_I terminal' signal) output from an AGC control section b with a level of control voltage ('V3_I terminal' signal) output from an AGC control section c. If the 'V3_I terminal' signal is below the 'V2_I terminal' signal, an AGC amplifier is controlled by the 'V3_I terminal' signal. If the 'V3_I terminal' signal is above the 'V2_I terminal' signal, the AGC amplifier is controlled by the 'V2_I terminal' signal. In the latter case, control information of the AGC control section b is replaced by control information of the AGC control section c so that the AGC control section c controls the AGC amplifier c.

14 Claims, 16 Drawing Sheets

AUTOMATIC GAIN CONTROL DEVICE

PRIORITY

This application claims priority to an application entitled "Automatic Gain Control Device" filed with the Japanese Patent Office on Jun. 28, 2004 and assigned Ser. No. 189326/2004, the contents of which are hereby incorporated by reference.

BACKGROUND OF THE INVENTION

1. Field of the Invention

The present invention relates to an automatic gain control device.

2. Description of the Related Art

In a conventional automatic gain control device having a filter in a control loop, an output signal of the conventional automatic gain control device may not be converged due to a delay of response characteristics thereof caused by a signal delay from the filter. In order to solve such a problem, a control method has been proposed in which, if a signal level has a sudden variation, a control signal generator for generating a control signal from the signal is switched to another control signal generator having an increased time constant to improve a delay of the control signal caused by the filter, and simultaneously, control information is copied between the control signal generators, such that an output signal of an automatic gain control device has no variation in level (for example, see Japanese Patent Publication No. 3240458).

Also, in the conventional automatic gain control device having the filter in the control loop, if a level control of an automatic gain control is performed by in-band signals of the filter, the automatic gain control is converged in conformity with levels of the in-band signals of the filter. Therefore, if out-of-band signals of the filter are greater than in-band signals of the filter, saturation caused by the out-of-band signals of the filter may occur in an amplifier disposed at a front end of the filter. Accordingly, a control method has been proposed in which amplifiers are cascade-connected through a filter and an automatic gain control is separately carried out with respect to each amplifier disposed at front and rear portions of the filter (for example, see Japanese Patent Publication No. 3086060).

Although the above-mentioned Japanese Patent Publication No. 3240458 discloses a technique capable of improving a delay of response characteristics caused by a signal delay from a filter and converging an output signal of an automatic gain control device, when a level control of an automatic gain control is carried out by in-band signals of the filter, this technique was not able to solve a problem in that saturation may occur in an amplifier disposed at a front end of the filter caused by out-of-band signals of the filter, if out-of-band signals of the filter are greater than in-band signals of the filter.

In addition, although the above-mentioned Japanese Patent Publication No. 3086060 can adjust a signal level at a front end of a filter by tracking variations of levels of out-of-band signals of the filter, if an automatic gain control for the amplifier disposed at the front end of the filter responds at high speed to according to variation of out-of-band signals of the filter, unnecessary variation may occur in the in-band target signals of the filter.

More specifically, if the automatic gain control for the amplifier disposed at the front end of the filter responds at high speed according to the variations of the signals, the in-band target signals of the filter may be subject to unnecessary variation, such that the automatic gain control for the amplifier disposed at the rear end of the filter must follow the variations of the target signals and thus a high-speed response characteristic is required. However, if the automatic gain control with respect to the target signals is carried out with the high-speed response, there is a problem in that signals may be modulated due to the automatic gain control and signal distortion may occur because of an amplitude compression action of the automatic gain control.

In the technique disclosed in the above-mentioned Japanese Patent Publication No. 3086060, therefore, the automatic gain control for the amplifier disposed at the front end of the filter must be performed with a low-speed response according to the variations of out-of-band signals of the filter. In this case, it is necessary to accept noise, which is generated by the out-of-band signals of the filter from low response characteristics of the automatic gain control. Otherwise, if the automatic gain control is performed at high speed with respect to both amplifiers disposed at front and rear ends of the filter, the technique according to the Japanese Patent Publication No. 3086060 must permit distortion of the target signals due to the automatic gain control for the amplifier disposed at the rear end of the filter. That is, in either case, communication quality cannot be improved.

SUMMARY OF THE INVENTION

Accordingly, the present invention has been designed to solve the above and other problems occurring in the prior art. An object of the present invention is to provide an automatic gain control device capable of reducing signal saturation or signal distortion caused by an out-of-band signal of a filter for extracting a target signal or a delay of a control signal, and precisely measuring a level of an in-band signal of the filter.

In order to accomplish the above object, in accordance with one aspect of the present invention, there is provided an automatic gain control device including: first variable gain amplifier means for amplifying an input signal; a filter for limiting a band of an output signal from the first variable gain amplifier means; second variable gain amplifier means for amplifying and externally outputting an output signal of the filter; first control signal generator means for generating a first control signal to control a level of the output signal of the first variable gain amplifier means to a predetermined level; second control signal generator means for generating a second control signal to control a level of an output signal of the second variable gain amplifier means to a predetermined level and outputting the second control signal to the second variable gain amplifier means; control signal selector means for selecting one of the first and second control signals output from the first and second control signal generator means and outputting the selected control signal to the first variable gain amplifier means; and reference information copier means for copying control information of the second control signal generator means into the first control signal generator means when the control signal output from the second control signal generator means is selected as the control signal for the first variable gain amplifier means.

In accordance with another aspect of the present invention, there is provided an automatic gain control device including: first variable gain amplifier means for amplifying an input signal; a filter for limiting a band of an output signal of the first variable gain amplifier means; second variable gain amplifier means for amplifying an output signal of the filter; third variable gain amplifier means for amplifying and externally outputting the output signal of the filter; first control signal generator means for generating a first control signal to control a level of the output signal of the first variable gain amplifier means to a predetermined level; second control signal generator means for generating a second control signal to control a level of an output signal of the second variable gain amplifier means to a predetermined level and outputting the second control signal to the second variable gain amplifier means; third control signal generator means, with a response characteristic faster than that of the second control signal generator means, for generating a third control signal for controlling a level of an output signal of the third variable gain amplifier means to a predetermined level and outputting the third control signal to the third variable gain amplifier means; control signal selector means for selecting one of the first and second control signals generated from the first and second control signal generator means and outputting the selected control signal to the first variable gain amplifier means; and reference information copier means for copying control information of the second control signal generator means into the first control signal generator means when the control signal output from the second control signal generator means is selected as the control signal for the first variable gain amplifier means.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Figure 1:
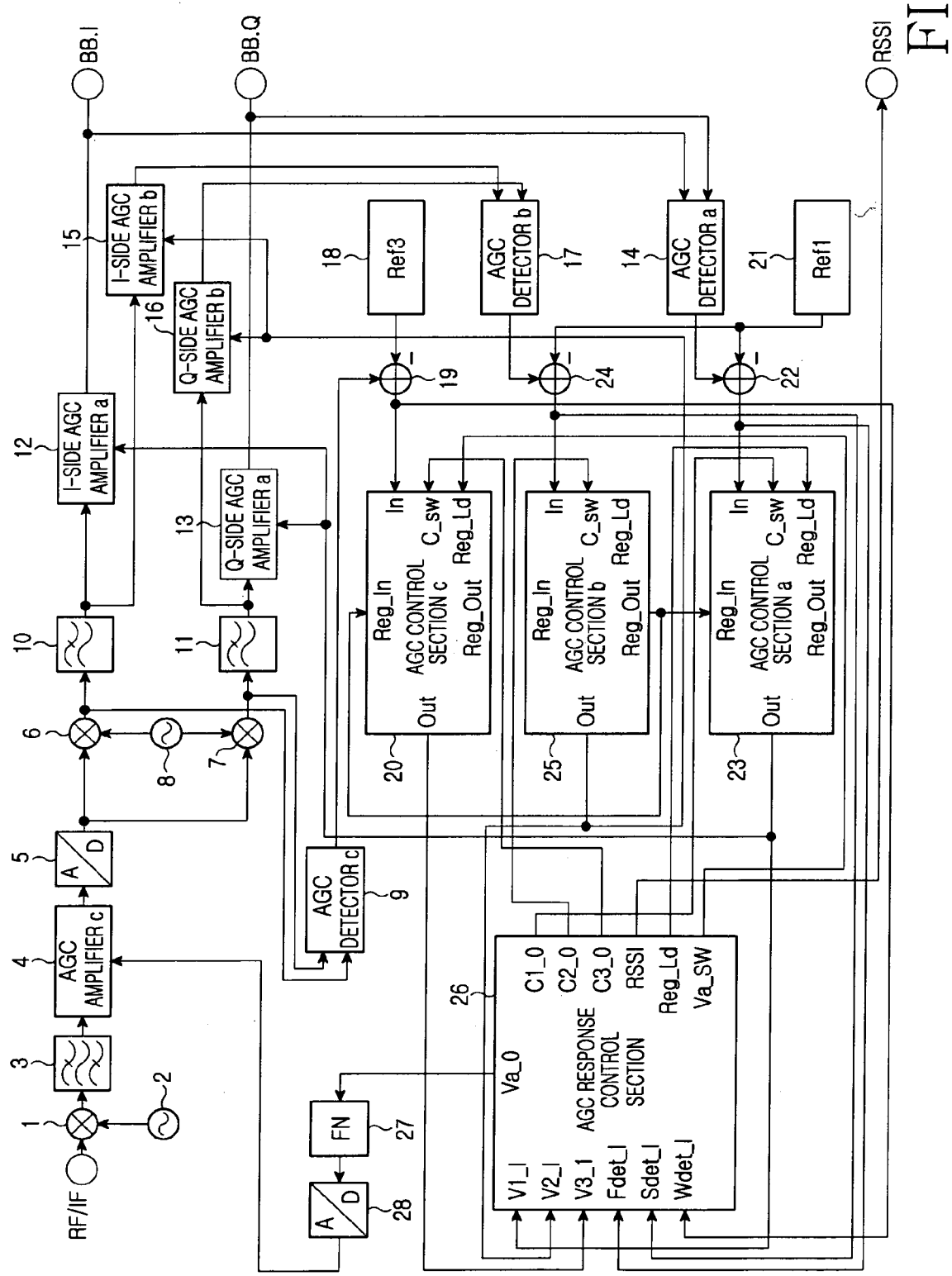
FIG. 1 is a block diagram illustrating a wireless apparatus having an automatic gain control (AGC) device in accordance with an embodiment of the present invention.

Preferred embodiments of the present invention will be described in detail herein below with reference to the accompanying drawings. It should be noted that the similar components are designated by similar reference numerals although they are illustrated in different drawings. Also, in the following description of the present invention, a detailed description of known functions and configurations incorporated herein will be omitted when it may obscure the subject matter of the present invention.

FIG. 1 is a block diagram illustrating a wireless apparatus having an automatic gain control (AGC) device in accordance with an embodiment of the present invention. Referring to FIG. 1, a signal input from an radio frequency/intermediate frequency (RF/IF) terminal into a mixer 1 is converted into a signal having a low frequency (the input IF frequency of analog/digital (A/D) converter to be described later) in the mixer 1 using a local signal having a first frequency, which is output from a local oscillator 2. Then, a signal having a predetermined frequency band is extracted from the signal output from the mixer using a bandpass filter 3.

An AGC amplifier c 4 is a variable gain amplifier for converting an output signal of the bandpass filter 3 into a signal having a constant level. The signal having the predetermined frequency band is converted into the signal having the constant level by the AGC amplifier c 4 and then is input into the A/D converter 5 to be converted into a quantized digital signal.

In addition, an orthogonal detection is performed with respect to the quantized digital signal in an I-side mixer 6 and a Q-side mixer 7 using a local signal (I-side: cosine wave, Q-side: -sine wave) having a second frequency output from a digital local oscillator 8 and is converted into a complex number signal having a baseband frequency represented by an I-axis signal and a Q-axis signal.

The complex number signal having the baseband frequency is input into an AGC detector c 9, and simultaneously, is converted into a band signal of a target band by limiting bands of the I-axis signal and the Q-axis signal of the complex number signal using an I-side channel filter 10 and a Q-side channel filter 11, respectively. In addition, the I-axis signal and the Q-axis signal are input into an I-side amplifier a 12 and a Q-side amplifier a 13, respectively.

In order to generate a gain control signal for the AGC amplifier c 4 in the AGC detector c 9, the AGC detector c 9 calculates square values of the I-axis signal and the Q-axis signal of the complex number signal having the baseband frequency and a square root value of the complex number signal. Variations of an output signal of the I-side mixer 6 and the Q-side mixer 7 are detected by integrating the square root value of the complex number signal.

In addition, I-side AGC amplifier a 12 and Q-side AGC amplifier a 13 are variable gain amplifiers for converting output signals of the I-side channel filter 10 and the Q-side channel filter 11 into signals having constant levels. Band signals of the target bands are converted into signals having constant levels by the I-side AGC amplifier a 12 and the Q-side AGC amplifier a 13 and are then output from the wireless apparatus as complex number signals BB.I and BB.Q, having baseband frequencies.

The band signals of the target bands, which are converted into signals having constant levels by the I-side AGC amplifier a 12 and the Q-side AGC amplifier a 13, are input into an AGC detector a 14. In order to generate a gain control signal for the I-side AGC amplifier a 12 and the Q-side AGC amplifier a 13 the AGC detector a 14, the AGC detector a 14, calculates square values of the I-axis signal and the Q-axis signal of the band signals of the target bands and square root values of the band signals. Variations of an output signal of the I-side AGC amplifier a 12 and the Q-side AGC amplifier a 13 are detected by integrating the square root values of the band signals.

Similarly, bands of an I-axis signal and a Q-axis signal of the band signals of the target bands are limited by the I-side channel filter 10 and the Q-side channel filter 11, respectively. Also, the I-axis signal and the Q-axis signal are input into an I-side amplifier b 15 and a Q-side amplifier b 16, respectively. The I-side amplifier b 15 and the Q-side amplifier b 16 are variable gain amplifiers for converting output signals of the I-side channel filter 10 and the Q-side channel filter 11 into signals having constant levels. The band signals of the target bands, which are converted into signals having constant levels by the I-side amplifier b 15 and the Q-side amplifier b 16, are input into an AGC detector b 17.

In order to generate a gain control signal for the I-side amplifier b 15 and the Q-side amplifier b 16, the AGC detector b 17 calculates square values of the I-axis signal and the Q-axis signal of the band signals of the target bands and square root values of the band signals. Variations of an output signal of the I-side amplifier b 15 and the Q-side amplifier b 16 are detected by integrating the square root values of the band signals.

The AGC detectors c 9, the AGC detector a 14, and the AGC detector b 17 will be described in more detail later.

The output signals of the AGC detector c 9, the AGC detector a 14, and the AGC detector b 17 are compared with reference values thereof, respectively, in order to generate gain control signals for each amplifier. Compared data is input into an AGC control section for generating the gain control signal for each amplifier. More specifically, a reference value Ref3 output from a reference value register 18 is subtracted from an output signal of the AGC detector c 9 using a subtractor 19 and the resultant value is input into an 'In terminal' of an AGC control section c 20.

In addition, a reference value Ref1 output from a reference value register 21 is subtracted from an output signal of the AGC detector a 14, using a subtractor 22 and the resultant value is input into an 'In terminal' of an AGC control section a 23. Also, the reference value Ref1 output from the reference value register 21 is subtracted from an output signal of the AGC detector b 17 using a subtractor 24 and the resultant value is input into an 'In terminal' of an AGC control section b 25 having slower response characteristics than those of the AGC control section a 23.

Herein, the AGC control section c 20, the AGC control section a 23, and the AGC control section b 25 multiply input signals input into 'In terminals' by a coefficient selected based on control signals input into 'C_sw terminals' and output the resultant value to 'Out terminals'. Additionally, the AGC control section c 20, the AGC control section a 23, and the AGC control section b 25 copy control information from 'Reg_Out terminals' into 'Reg_In terminals' based on control signals input into 'Reg_Ld terminals'.

More specifically, in FIG. 1, the 'Reg_Out terminal' of the AGC control section b 25 is connected to the 'Reg_In terminal' of the AGC control section a 23, and control information of the AGC control section b 25 is copied into the AGC control section a 23 based on a control signal input into the 'Reg_Ld terminal' of the AGC control section a 23. Also, the 'Reg_Out terminal' of the AGC control section b 25 is connected to the 'Reg_In terminal' of the AGC control section c 20, and control information of the AGC control section b 25 is copied into the AGC control section c 20 based on a control signal input into the 'Reg_Ld terminal' of the AGC control section c 20.

The AGC control section c 20, the AGC control section a 23, and the AGC control section b 25 will be described in more detail later. In the following description, functions of terminals that are not connected to each other in the respective AGC control sections is assumed to be used in the present invention and thus will not be discussed.

The 'Out terminal' of the AGC control section a 23 is connected to a 'V1_I terminal' of AGC response control section 26, and gain control terminals of the I-side AGC amplifier a 12 and the Q-side AGC amplifier a 13, such that gains of the I-side AGC amplifier a 12 and the Q-side AGC amplifier a 13 can be controlled using an output signal of the 'Out terminal' of the AGC control section a 23. Similarly, the 'Out terminal' of the AGC control section b 25 is connected to a 'V2_I terminal' of the AGC response control section 26 as well as gain control terminals of the I-side AGC amplifier b 15 and the Q-side AGC amplifier b 16, such that gains of the I-side AGC amplifier b 15 and the Q-side AGC amplifier b 16 can be controlled using an output signal of the 'Out terminal' of the AGC control section b 25. Additionally, the 'Out terminal' of the AGC control section c 20 is connected to a 'V3_I terminal' of the AGC response control section 26.

The AGC response control section 26 controls response characteristics of each AGC control section and outputting a gain control signal for the AGC amplifier c 4. More specifically, a signal created by subtracting the reference value Ref3 of the reference value register 18 from the output signal of the AGC detector c 9 in the subtractor 19 is input into a 'Wdet_I terminal' of the AGC response control section 26. Similarly, a signal created by subtracting the reference value Ref1 of the reference value register 21 from the output signal of the AGC detector a 14, in the subtractor 22 is input into an 'Fdet_I terminal' of the AGC response control section 26. Further, a signal created by subtracting the reference value Ref1 of the reference value register 21 from the output signal of the AGC detector b17 in the subtractor 24 is input into an 'Sdet_I terminal' of the AGC response control section 26.

In addition, a 'C1_O terminal' of the AGC response control section 26 is connected to a 'C_sw terminal' of the AGC control section a 23, a 'C2_O terminal' of the AGC response control section 26 is connected to a 'C_sw terminal' of the AGC control section b 25, and a 'C3_O terminal' of the AGC response control section 26 is connected to a 'C_sw terminal' of the AGC control section c 20. Further, the 'Reg_Ld terminal' of the AGC response control section 26 is connected to the 'Reg_Ld terminal' of the AGC control section a 23 to control the copying of the control signal from the AGC control section b 25 to the AGC control section a 23. Similarly, the 'Va_SW terminal' of the AGC response control section 26 is connected to the 'Reg_Ld terminal' of the AGC control section c 20 to control the copying of the control signal from the AGC control section b 25 to the AGC control section c 20.

A 'Va_O' terminal of the AGC response control section 26 outputs a gain control signal for the AGC amplifier c 4. The gain control signal output from the 'Va_O' terminal of the AGC response control section 26 is converted into an analog signal using a D/A converter through a function block 27 for finely adjusting response characteristics of the AGC device according to the present invention and is input into a gain control terminal of the AGC amplifier c 4. The AGC response control section 26 will be described in detail later.

In addition, the wireless apparatus includes a controller (not shown) for updating reference values held in each reference value register and internal register values for determining the response characteristic of each AGC control section and simultaneously controlling the function block 27.

AGC Detector

Hereinafter, AGC detector c 9, AGC detector a 14, and AGC detector c 17 of the AGC device according to an embodiment of the present invention will be described in detail with reference to accompanying drawings.

The AGC detector c 9, the AGC detector a 14, and the AGC detector c 17 have the same structure as each other. More specifically, FIG. 2 illustrates an AGC detector (complex input type) of the automatic gain control device according to an embodiment of the present invention.

Figure 2:
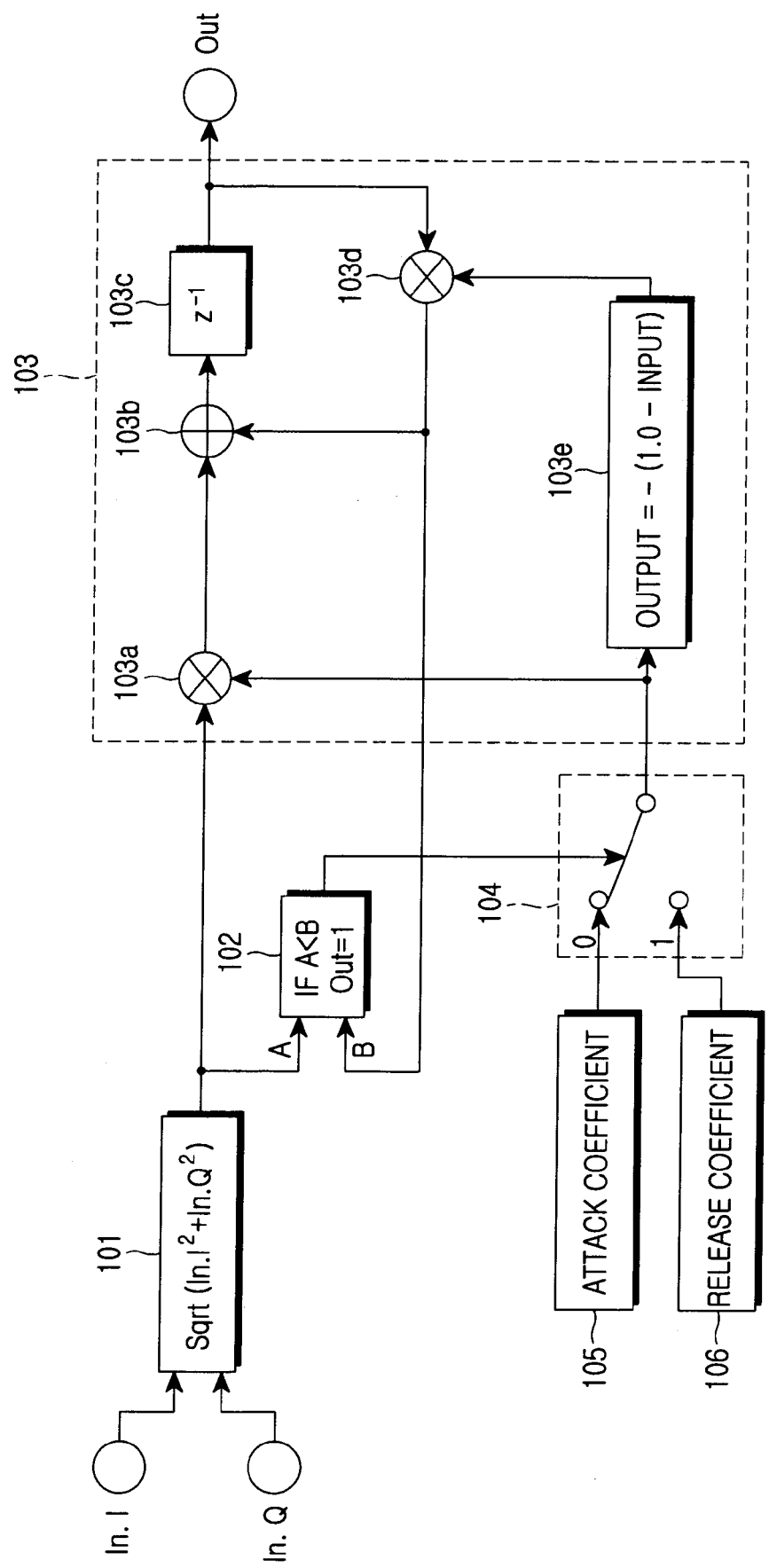
FIG. 2 is a block diagram illustrating an AGC detector (complex input type) of the AGC device according to an embodiment of the present invention.

Referring to FIG. 2, as a complex signal is input through an 'In.I terminal' and an 'In.Q terminal', an amplitude calculator 101 calculates square values of an I-axis signal and a Q-axis signal, and adds the square values to the complex signal. Simultaneously, a square root value of the complex signal is calculated. An output signal of the amplitude calculator 101 is input into a comparator 102 and simultaneously input into an integrator 103 including a multiplier 103a, an adder 103b, a delay unit 103c, a multiplier 103d, and a coefficient calculator 103e.

Herein, the integrator 103 integrates an output signal of the amplitude calculator 101 based on any one of an attack coefficient output from an attack coefficient register 105 and a release coefficient output from a release coefficient register 106 (provided that an attack coefficient value is larger than a release coefficient value), which is selected by a switch 104, the switching of which is controlled by means of an output signal of the comparator 102. That is, the output signal of the amplitude calculator 101 input into the integrator 103 is multiplied by any one of the attack coefficient and the release coefficient, which are input into the integrator 103 as numerator coefficients, in the multiplier 103a.

In addition, a denominator coefficient of the attack coefficient or the release coefficient input into the integrator 103 is calculated using the coefficient calculator 103e. An output signal of the coefficient calculator 103e is multiplied by an output signal of the integrator 103 in the multiplier 103d and the resultant value is added to an output signal of the multiplier 103a using the adder 103b. Also, an output signal of the adder 103b is output from an 'Out terminal' via the delay unit 103c as an output signal of the integrator 103, i.e., as an output signal of the AGC detector.

The comparator 102 compares the output signal of the amplitude calculator 101 with an output signal of the multiplier 103d. If the output signal of the amplitude calculator 101 is smaller than the output signal of the multiplier 103d, the switch 104 selects the release coefficient such that an integration time constant is enlarged. If the output signal of the amplitude calculator 101 is larger than the output signal of the multiplier 103d, the switch 104 selects the attack coefficient such that the integration time constant is diminished. Accordingly, the value of the output signal of the integrator 103 may be between an effective value and a peak value of an input signal.

AGC Control Section

Hereinafter, AGC control section c 20, AGC control section a 23, and AGC control section b 25 of the AGC device according to an embodiment of the present invention will be described in detail with reference to accompanying drawings. It is noted that the AGC control section c 20, the AGC control section a 23 and the AGC control section b 25 have the same structure as each other.

Figure 3:
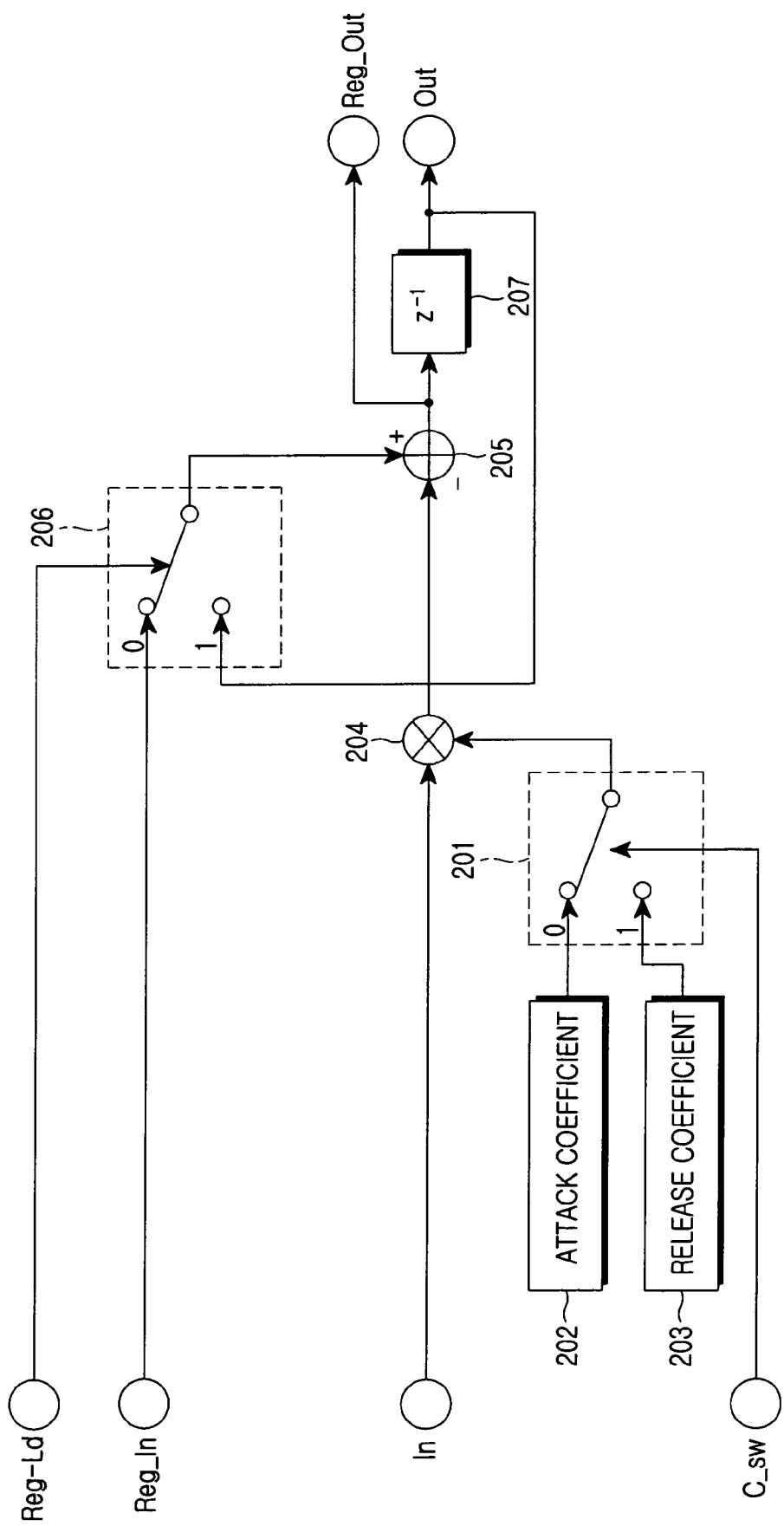
FIG. 3 is a block diagram illustrating an AGC control section of the AGC device according to an embodiment of the present invention.

FIG. 3 illustrates an AGC control section of an AGC device. Referring to FIG. 3, an input signal input from an 'In terminal' is multiplied by any one of an attack coefficient and a release coefficient (provided that an attack coefficient value is larger than a release coefficient value) in a multiplier 204, into which the attack coefficient is output from an attack coefficient register 202. The release coefficient is output from a release coefficient register 203 according to a selection of a switch 201, the switching of which is controlled based on a control signal input into a 'C_sw terminal'.

In addition, an output signal of the multiplier 204 is input into a subtractor 205 and is subtracted from any one of an output signal of the AGC control section and a signal input into a 'Reg_In terminal' thereof, which is selected by a switch 206, the switching of which is controlled based on a control signal input into a 'Reg_Ld terminal', in the subtractor 205.

An output signal from the subtractor 205 is output through a 'Reg_Out terminal' and is input into a delay unit 207. In addition, an output signal of the delay unit 207 is output through an 'Out terminal' as an output signal of the AGC control section.

The switch 201 selects the attack coefficient output from the attack coefficient register 202, if the control signal input into the 'C-sw terminal' is '0', and selectively outputs the release coefficient output from the release coefficient register 203, if the control signal input into the 'C-sw terminal' is '1'.

In addition, the switch 206 selects the output signal of the subtractor 205, if the control signal input into the 'Reg_Id terminal' is '0', and selectively outputs an input signal input into the 'Reg_In terminal', if the control signal input into the 'Reg-Ld terminal' is '1'.

AGC Response Control Section

Hereinafter, an AGC response control sections 26 of an AGC device according to an embodiment of the present invention will be described in detail with reference to accompanying drawings. More specifically, FIGS. 4 and 5 illustrate the AGC response control section of the AGC device according to an embodiment of the present invention.

Figure 4:
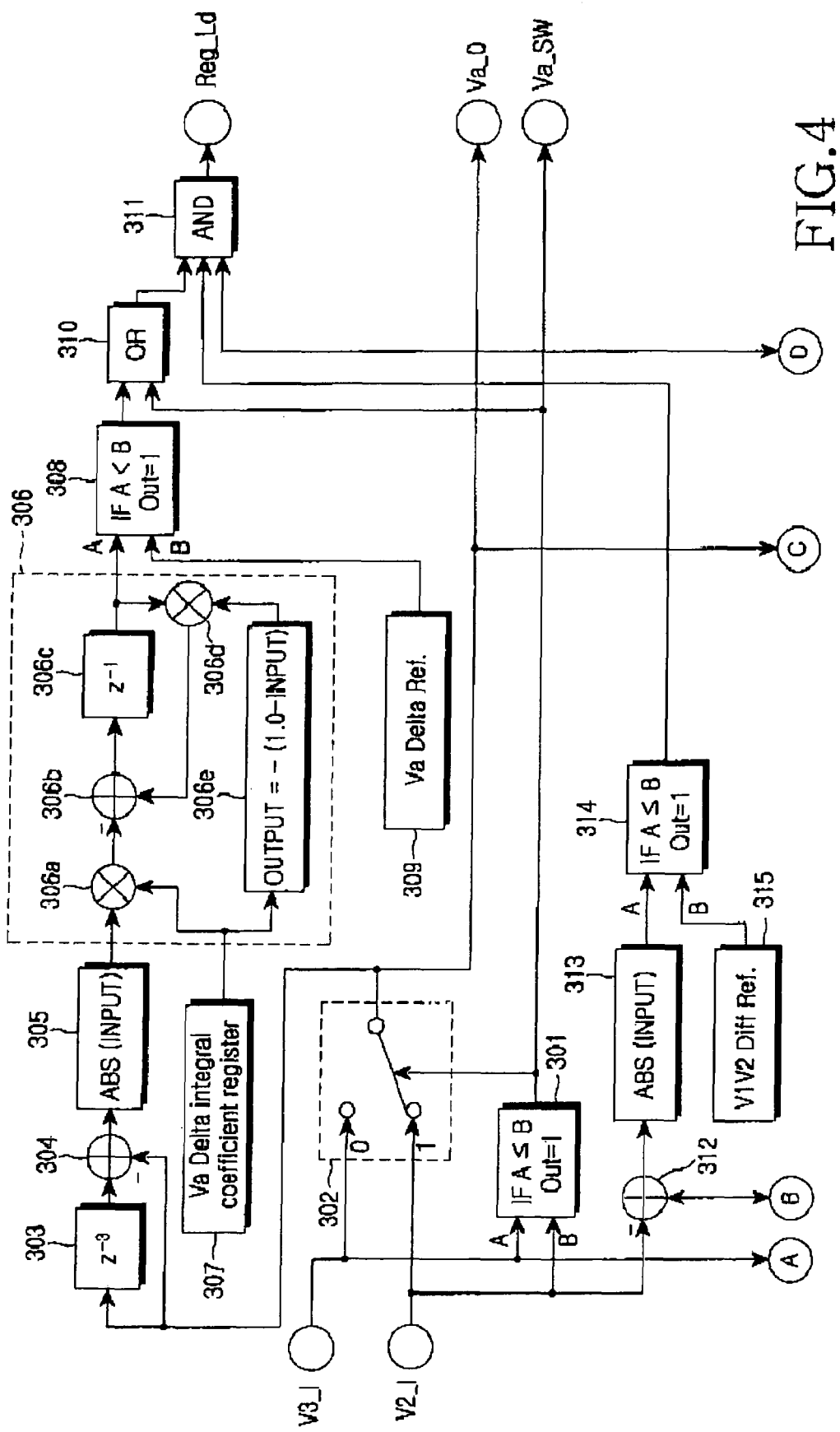
FIG. 4 is a block diagram illustrating an AGC response control section of the AGC device according to an embodiment of the present invention.
Figure 5:
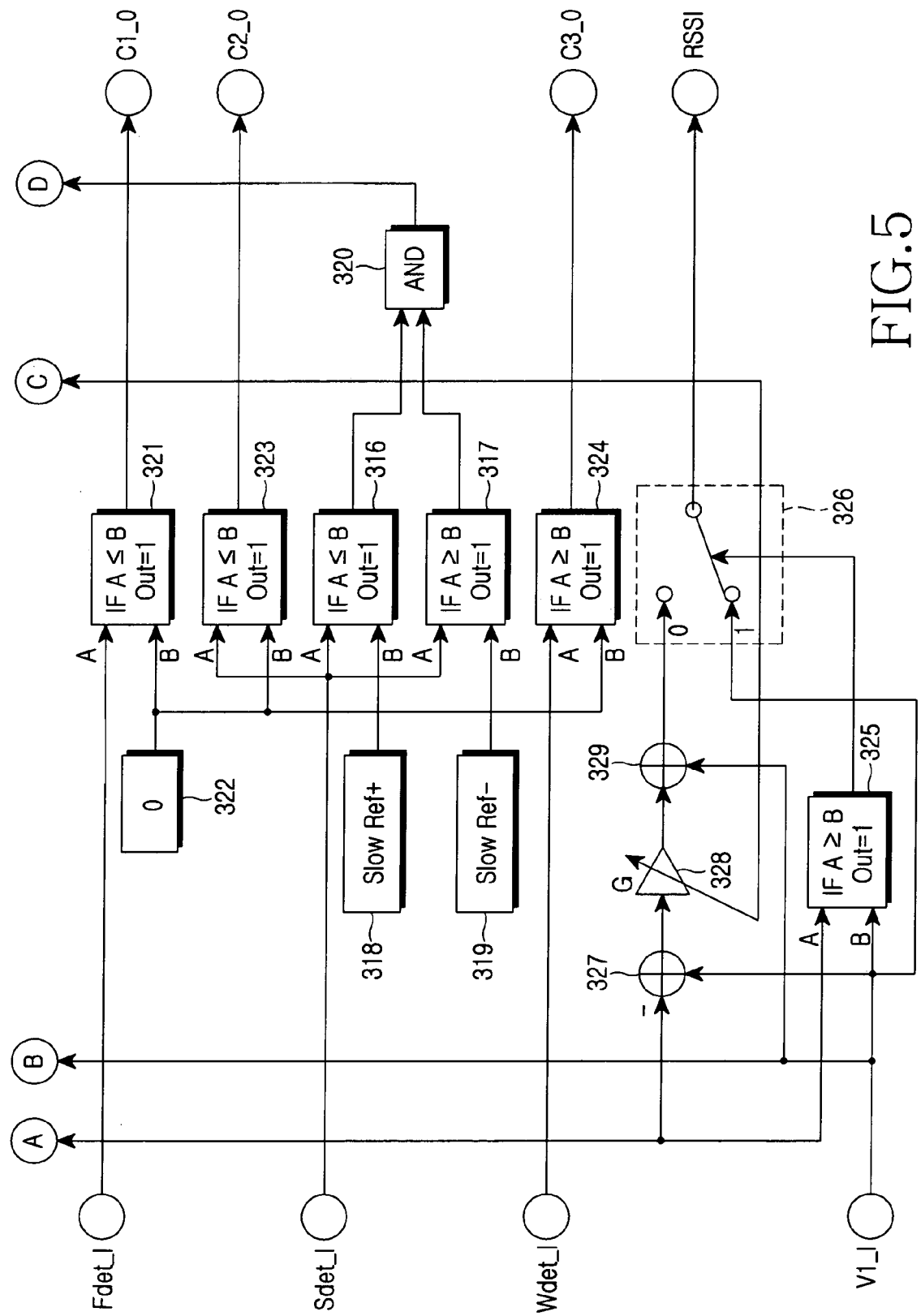
FIG. 5 is a block diagram illustrating an AGC response control section of the AGC device according to an embodiment of the present invention.

Referring to FIGS. 4 and 5, signals input from the 'V2_I terminal' and the 'V3_I terminal' are compared with each other in a comparator 301. Simultaneously, one of the signals input from the 'V2_I terminal' and the 'V3_I terminal' is selected by a switch 302, the switching of which is controlled using an output signal of the comparator 301, and the selected signal is output to the 'Va_O terminal'. The output signal of the comparator 301 is also input to the 'Va-SW terminal'.

In addition, if the signal input into the 'V3_I terminal' is equal to or smaller than the signal input into the 'V2_I terminal', the comparator 301 outputs '0', and the switch 302 outputs the signal input into the 'V3_I terminal' to the 'Va_O terminal'.

If the signal input into the 'V3_I terminal' is larger than the signal input into the 'V2_I terminal', the comparator 301 outputs '1', and the switch 302 outputs the signal input into the 'V2_I terminal' to the 'Va_O terminal'.

In addition, an output signal of the switch 302 is delayed by a delay unit 303. Simultaneously, the output signal of the switch 302 delayed by the delay unit 303 is differentiated by subtracting the output signal of the switch 302 from the delayed output signal of the switch 302 in a subtractor 304. Additionally, an absolute value of the output signal of the switch 302 is calculated using an absolute value calculator 305.

An output signal of the absolute value calculator 305 is input into an integrator 306 including a multiplier 306a, an adder 306b, a delay unit 306c, a multiplier 306d, and a coefficient calculator 306e. Here, the integrator 306 integrates the output signal of the absolute value calculator 305 based on a 'Va Delta integral coefficient' output from a Va Delta integral coefficient register 307. That is, the output signal of the absolute value calculator 305 input into the integrator 306 is multiplied by the 'Va Delta integral coefficient' input into the integrator 306 as a numerator coefficient of the integrator in the multiplier 306a.

In addition, a denominator coefficient of the 'Va Delta integral coefficient' input into the integrator 306 is calculated using the coefficient calculator 306e. An output signal of the coefficient calculator 306e is multiplied by the output signal of the integrator 305 in the multiplier 306d and the resultant value is added to an output signal of the multiplier 306a in the adder 306b. An output signal of the adder 306b passes through the delay unit 306 and is output as an output signal of the integrator 306. Therefore, a variation degree of a signal output to the 'Va_O terminal' can be calculated.

The output signal of the integrator 306 is input into a comparator 308 to be compared with a reference value 'Va Delta Ref.' output from a Va reference value register 309. The comparator 308 outputs '1' if the output signal of the integrator 306, i.e., the variation degree of the signal output to the 'Va_O terminal' is smaller than the reference value 'Va Delta Ref'.

In addition, a logical sum of the output signals from the comparators 301 and 308 is derived from an OR circuit 310 and is input into an AND circuit 311 disposed in front of the OR circuit 310. Accordingly, if the signal input into the 'V3_I terminal' is larger than the signal input into the 'V2_I terminal', or if the variation degree of the signal output to the 'Va_O terminal' is smaller than the reference value 'Va Delta Ref.', '1' is input into the AND circuit 311.

Also, the signal input through the 'V2_I terminal' is subtracted from the signal input through the 'V1_I terminal' in a subtractor 312. Simultaneously, an output signal of the subtractor 312 is input into an absolute value calculator 313 to calculate an absolute value of the output signal of the subtractor 312. Further, an output signal of the absolute value calculator 313 is output to a comparator 314 to be compared with a reference value 'V1 V2 Diff Ref' output from a V1-V2 differential value register 315.

If a comparison result shows that an absolute value of a differential value between the signal input into the 'V1_I terminal' and the signal input into the 'V2_I terminal' is equal to or smaller than the reference value 'V1 V2 Diff Ref', an output signal of the comparator 314 becomes '1' and '1' is input into the AND circuit 311. In addition, if the absolute value of the differential value between the signal input into the 'V1_I terminal' and the signal input into the 'V2_I terminal' is larger than the reference value 'V1 V2 Diff Ref', the output signal of the comparator 314 becomes '0', and '0' is input into the AND circuit 311.

The signal input into the 'Sdet_I terminal' is compared with a reference value 'Slow Ref+' output from a register 318 for checking an upper limit value of convergence in a comparator 316, and is compared with a reference value 'Slow Ref-' output from a register 319 for checking a lower limit value of convergence in a comparator 317. In addition, output signals of the comparators 316 and 317 are input into the AND circuit 311 via an AND circuit 320.

Also, the output signal of the comparator 316 becomes '1' if the signal input into the 'Sdet_I terminal' is equal to or smaller than the reference value 'Slow Ref+', and the output signal of the comparator 317 becomes '1' if the signal input into the 'Sdet_I terminal' is greater than the reference value 'Slow Ref-', such that '1' is input into the AND circuit 311 via the AND circuit 320 when the signal input into the 'Sdet_I terminal' is in a range between the reference value 'Slow Ref-' and the reference value 'Slow Ref+'.

The output signal of the comparator 316 becomes '0' if the signal input into the ' Sdet_I terminal' is greater than the reference value 'Slow Ref+' and the output signal of the comparator 317 becomes '0' if the signal input into the 'Sdet_I terminal' is smaller than the reference value 'Slow Ref-', '0' is input into the AND circuit 311 via the AND circuit 320.

In addition, a logical multiplication of the output signals from the OR circuit 310 and the comparators 314 and 320 is derived from the AND circuit 311, and an output signal of the AND circuit 311 is output to the 'Reg_Ld terminal'.

The signal input into the 'Fdet_I terminal' is compared with a reference value '0' output from a zero register 322 in a comparator 321. At this time, if the signal input into the 'Fdet_I terminal' is equal to or smaller than the reference value '0', an output signal of the comparator 321 becomes '1' and is output to the 'C1_O terminal'. In addition, if the signal input into the 'Fdet_I terminal' is greater than the reference value '0', the output signal of the comparator 321 becomes '0' and is output to the 'C1_O terminal'.

The signal input into the 'Sdet_I terminal' is compared with the reference value '0' output from the zero register 322 using a comparator 323. If the signal input into the 'Sdet_I terminal' is equal to or smaller than the reference value '0', an output signal of the comparator 323 becomes '1' and is output to the 'C2_O terminal'. Also, if the signal input into the 'Sdet_I terminal' is greater than the reference value '0', the output signal of the comparator 323 becomes '0' and is output to the 'C2_O terminal'.

In addition, the signal input into the 'Wdet_I terminal' is compared with the reference value '0' output from the zero register 322 using a comparator 324. If the signal input into the 'Wdet_I terminal' is equal to or smaller than the reference value '0', an output signal of the comparator 324 becomes '1' and is output to the 'C3_O terminal'. Also, if the signal input into the 'Wdet_I terminal' is greater than the reference value '0', the output signal of the comparator 324 becomes '0' and is output to the 'C3_O terminal'.

The signals input into the 'V1_I terminal' and the 'V3_I terminal' are compared with each other in a comparator 325. Simultaneously, any one of the signal input into the 'V1_I terminal' and a signal, which is created by compensating for the signal input into the 'V1_I terminal' using the signal input into the 'V3_I terminal', is selected by a switch 326, the switching of which is controlled using an output signal of the comparator 325. Thereafter, the selected signal is output to an 'RSSI terminal' as an RSSI (Received Signal Strength Indicator) signal.

When the signal input into the 'V3_I terminal' is equal to or greater than the signal input into the 'V1_I terminal', the output signal of the comparator 325 becomes '1', such that the switch 326 outputs the signal input into the 'V1_I terminal' to the 'RSSI terminal'. In addition, if the signal input into the 'V3_I terminal' is smaller than the signal input into the 'V1_I terminal', the output signal of the comparator 325 becomes '0', such that the switch 326 outputs the signal, which is created by compensating for the signal input into the 'V1_I terminal' using the signal input into the 'V3_I terminal', to the 'RSSI terminal'.

In addition, the compensation for the signal input into the 'V1_I terminal' using the signal input into the 'V3_I terminal' can be expressed shown in Equation (1), in which signals of each terminal are represented as terminal names.

$$\text{'RSSI'} = \text{'V1\_I'} + (G3(V1)/G(V1))(\text{'V1\_I'} - \text{'V3\_I'}) \quad (1)$$

More specifically, ('V1_I'−'V3_I') is calculated by a subtractor 327. An output signal of the subtractor 327 is multiplied by a coefficient (G3(V1)/G(V1)) using a variable gain amplifier 328, and 'V1_I' is added thereto in an adder 329. Accordingly, an output according to the above equation can be obtained.

Characteristic of AGC Amplifiers

Hereinafter, the characteristic of the AGC amplifiers used in an AGC device according to an embodiment of the present invention will be described with reference to accompanying drawings.

Figure 6:
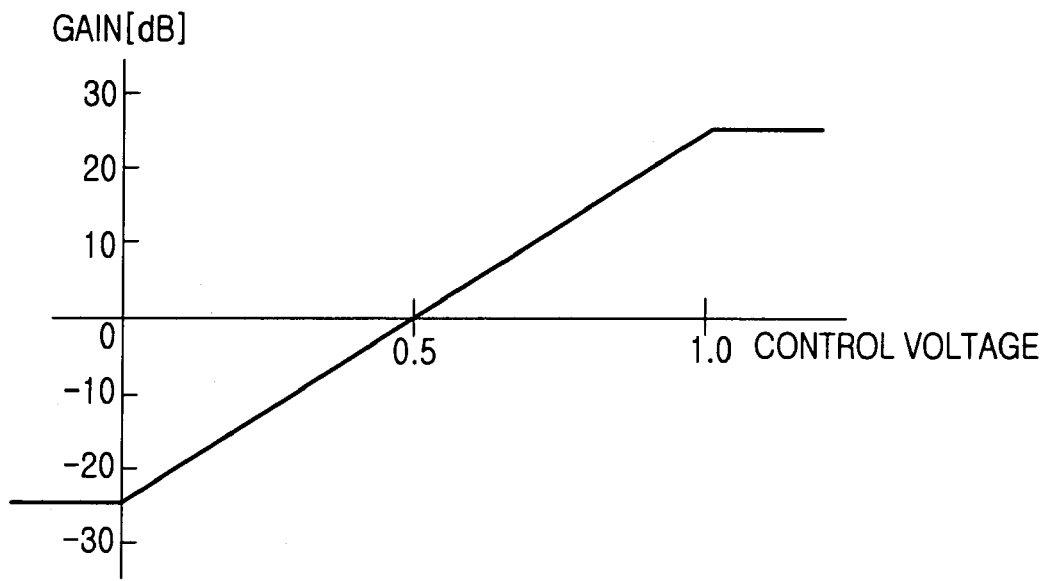
FIG. 6 is a graph illustrating a gain characteristic of an AGC amplifier as a function of control voltage when the AGC amplifier is disposed at a rear end of a channel filter of the AGC device according to an embodiment of the present invention.

FIG. 6 is a graph illustrating a gain characteristic as a function of control voltage in the I-side AGC amplifier a 12, Q-side AGC a amplifier 13, I-side AGC amplifier b 15, and Q-side AGC amplifier b 16. According to the characteristic of each AGC amplifier, the gain is constantly maintained at −25 [dB] when the control voltage is below 0.0, and is constantly maintained at 25 [dB] when the control voltage is above 1.0. When the control voltage is in a range between 0.0 and 1.0, the gain increases by 5 [dB] as the control voltage increases by 0.1. The gain becomes 0 [dB] when the control voltage becomes 0.5.

Figure 7:
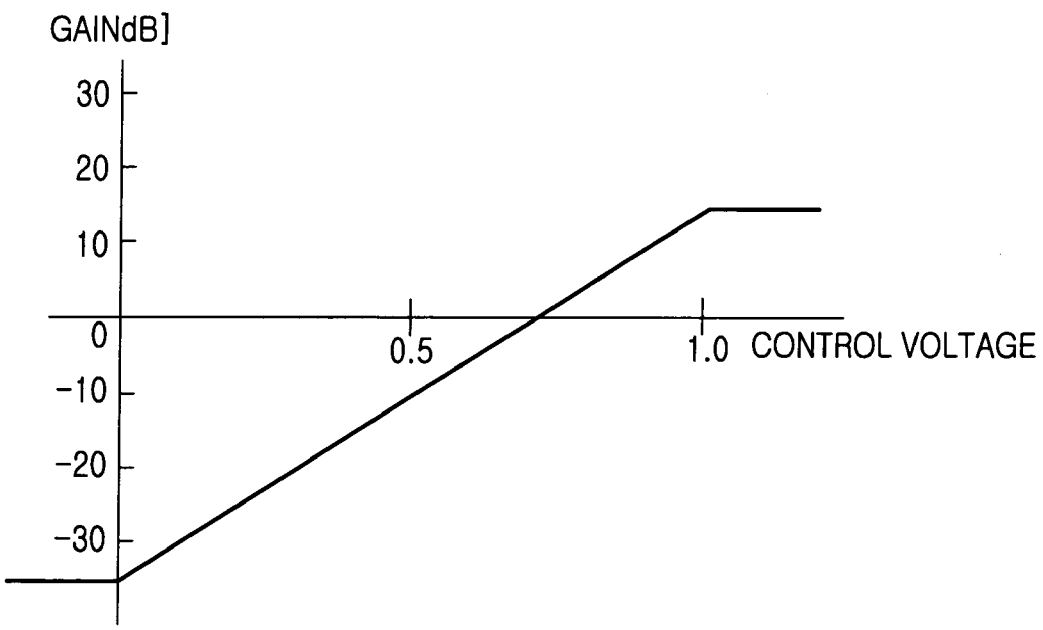
FIG. 7 is a graph illustrating a gain characteristic of an AGC amplifier as a function of control voltage when the AGC amplifier is disposed at a front end of the channel filter of the AGC device according to an embodiment of the present invention.

FIG. 7 is a graph illustrating a gain characteristic as a function of control voltage in the AGC amplifier c 4. According to the characteristic of the AGC amplifier c 4, a gain is constantly represented as −35 [dB] when the control voltage is below 0.0 and is constantly represented as 15 [dB] when the control voltage is above 1.0. In addition, when the control voltage is in a range between 0.0 and 1.0, the gain increases by 5 [dB] as the control voltage increases by 0.1. The gain becomes 0 [dB] when the control voltage becomes 0.7.

Operation of Automatic Gain Control Device

Hereinafter, an operation of an AGC device having the above-described structure according to an embodiment of the present invention will be described in detail.

Overall Operation

The AGC device according to this embodiment includes a first AGC loop and a second AGC loop disposed at rear ends of the I-side channel filter 10 and the Q-side channel filter 11, respectively. The first AGC loop includes the I-side AGC amplifier a 12, the Q-side AGC amplifier a 13, the AGC detector a 14, and the AGC control section a 23 and performs a high-speed response. The second AGC loop includes the I-side AGC amplifier b 15, the Q-side AGC amplifier b 16, the AGC detector b 17, and the AGC control section b 25 and performs a low-speed response with a low signal distortion. An output signal of the automatic gain control device is extracted from the first AGC loop.

In addition, a third AGC loop including the AGC amplifier c 4, the AGC detector c 9, and the AGC control section c 20 is disposed at front ends of the I-side channel filter 10 and the Q-side channel filter 11 to detect an overall signal level before out-of-band signals of target bands are suppressed by the I-side channel filter 10 and the Q-side channel filter 11.

The AGC response control section 26 controls the AGC amplifier c 4 in consideration of the bands of the I-side channel filter 10 and the Q-side channel filter 11 as well as the overall signal level input into the automatic gain control device only when the overall signal level is equal to or higher than a predetermined value. Therefore, if the overall signal level before out-of-band signals of the target bands are suppressed is higher than the predetermined value, the AGC response control section 26 controls the AGC amplifier c 4 using control voltage output from the AGC control section c 20. However, if the overall signal level before the out-of-band signals of the target bands are suppressed is equal to or lower than the predetermined value, the AGC response control section 26 controls the AGC amplifier c 4 using control voltage output from the AGC control section b 25.

More specifically, a level of the control voltage output from the AGC control section 25 and input into the 'V2_I terminal' is compared with a level of the control signal output from the AGC control section c 20 and input into the 'V3_I terminal' in the AGC response control section 26. If the control voltage ('V3_I terminal' signal) output from the AGC control section c 20 is equal to or lower than the control voltage ('V2_I terminal' signal) output from the AGC control section b 25, the AGC response control section 26 controls the AGC amplifier c 4 using the control voltage ('V3_I terminal' signal) output from the AGC control section c 20.

In addition, if the control voltage ('V3_I terminal' signal) output from the AGC control section c 20 is higher than the control voltage ('V2_I terminal' signal) output from the AGC control section b 25, the AGC response control section 26 controls the AGC amplifier c 4 using the control voltage ('V2_I terminal' signal) output from the AGC control section b 25. That is, the AGC response control section 26 selects a control signal capable of lowering the gain of the AGC amplifier c 4 and outputs the control signal to the AGC amplifier c 4.

Therefore, if the levels of the in-band signals of the I-side channel filter 10 and the Q-side channel filter 11 are lower than the levels of out-of-band signals of the filter input into the automatic gain control device, the AGC response control section 26 may control the AGC amplifier c 4 using the control voltage output from the AGC control section c 20, which follows the overall signal level including out-of-band signals of the filter, such that the control voltage output from the AGC control section b 25 may suppress an increase of the gain of the AGC amplifier 4, which is required to increase the level of the in-band signal of the I-side channel filter 10 and the Q-side channel filter 11 to a predetermined level. Accordingly, the overall signal level including the out-of-band signals of the filter can be restricted within a predetermined value.

Signal saturation of the AGC amplifier created at the front ends of the I-side channel filter 10 and the Q-side channel filter 11 due to out-of-band signals of the filter or signal distortion caused by characteristics of a non-linear area of the AGC amplifier can be prevented. In addition, if the gain of the AGC amplifier c 4 is suppressed using the control voltage output from the AGC control section c 20, the AGC loop is operated with the signal level including out-of-band signals of the filter, such that a level of a target signal is lowered as compared with an original signal level thereof. However, the level of the target signal is compensated for by a gain control of the I-side AGC amplifier a 12 and the Q-side amplifier a 13 disposed at the rear ends of the I-side channel filter 10 and the Q-side channel filter 11 and so the original signal level is output as the target signal level.

Change of Response Speed of AGC Control Section

If it is unnecessary for the first AGC loop including the I-side AGC amplifier a 12, the Q-side AGC amplifier a 13, the AGC detector a 14, and the AGC control section a 23 to follow a high-speed response to the output signal of the AGC amplifier c 4, the first AGC loop can copy control information of the second AGC loop, which performs the low-speed response with low signal distortion and includes the I-side AGC amplifier b 15, the Q-side AGC amplifier b 16, the AGC detector b 17, and the AGC control section b 25, thereby lowering the response characteristic of the first AGC loop and so reducing signal distortion thereof.

More specifically, if the AGC response control section 26 is satisfied with the following three conditions (AND conditions), '1' is output to the 'Reg_Ld terminal' and input into the 'Reg_Ld terminal' of the AGC control section a 23. Simultaneously, the control signal of the AGC control section b 25 is input into the 'Reg_In terminal' of the AGC control section a 23 from the 'Reg_Out terminal' of the AGC control section b 25. Therefore, in the AGC control section a 23, a signal output from the multiplier 204 is subtracted from a signal input into the 'Reg_In terminal' of the AGC control section a 23 using the subtractor 205, and the subtracted signal is output to the 'Reg_Out terminal' and is simultaneously input into the delay unit 207. Accordingly, a control voltage information output from the AGC control section b 25 includes a control voltage output from the AGC control section a 23, such that the control voltage output from the 'Out terminal' of the AGC control section a 23 becomes equal to the control voltage output from the AGC control section b 25.

Condition 1

A strong signal may exist out of a filter band, and the variation degree of a signal output from the 'Va_O terminal' is at least lower than the reference value 'Va Delta Ref.' even when the control voltage ('V3_I terminal' signal) output from the AGC control section c 20 is lower than the control voltage ('V2_I terminal' signal) output from the AGC control section b 25. Otherwise, a strong signal out of the filter band may not exist and the control voltage ('V2_I terminal' signal) output from the AGC control section b 25 is lower than the control voltage ('V3_I terminal' signal) output from the AGC control section c 20.

Condition 2

Signal variation in the filter is very small, and a differential value between the control voltage ('V1_I terminal' signal) output from the AGC control section a 23 and the control voltage ('V2_I terminal' signal) output from the AGC control section b 25 is lower than the reference value 'V1 V2 Diff Ref.' output from the V1–V2 differential value register 315.

Condition 3

The second AGC loop performing the low-speed response and including the I-side AGC amplifier 15, the Q-side AGC amplifier 16, the AGC detector 17, and the AGC control section 25 is converged, and the signal input into the 'Sdet_I terminal' is greater than the reference value 'Slow Ref-' and is smaller than the reference value 'Slow Ref+'.

Improvement in Compliance of AGC Response Control Section

In addition, when a gain control of the AGC amplifier c 4 is performed based on a control signal output from the AGC control section b 25, control information of the AGC control section b 25 is copied into the AGC control section c 20, such that the AGC control section c 20 suppresses its operations of controlling output signals of the AGC amplifier c 4, which is not controlled from the AGC control section c 20, and a control voltage output from the AGC control section c 20 approaches to that of the AGC control section b 25. Therefore, the AGC response control section 26 can easily switch a gain control of the AGC amplifier c 4 from a control using the control voltage output from the AGC control section b 25 to a control using the control voltage output from the AGC control section c 20.

More specifically, if the control voltage ('V3_I terminal' signal) output from the AGC control section c 20 is higher the control voltage ('V2_I terminal' signal) output from the AGC control section c 20, the AGC response control section 26 outputs '1' to the 'Va_SW terminal' and '1' is input into the 'Reg_Ld terminal' of the AGC control section c 20. Simultaneously, a control signal of the AGC control section b 25 is input from the 'Reg_Out terminal' of the AGC control section b 25 into the 'Reg_In terminal' of the AGC control section c 20. Accordingly, in the AGC control section c 20, a signal output from the multiplier 204 is subtracted from the control signal input into the 'Reg_In terminal' of the AGC control section c 20 using the subtractor 205, and the subtracted signal is output to the 'Reg_Out terminal' and simultaneously is input into the delay unit 207. Therefore, a control voltage information output from the AGC control section b 25 includes a control voltage output from the AGC control section c 20, such that the control voltage output from the 'Out terminal' of the AGC control section c 20 approaches to the control voltage output from the AGC control section b 25.

Gain Distribution Control Based on Variation of Reference Value

When it is possible to obtain quality information of a received signal from a signal demodulation section connected to a rear end of the automatic gain control device, it is necessary to minimize deterioration in signal receiving performance caused by the signal distortion and an inferior SNR (signal to noise ratio). In addition, it may be necessary to update the reference value 'Ref3' output from the reference value register 18 and subtracted from the output signal of the AGC detector c 9 in the subtractor 19 based on obtained quality information and to perform a level distribution control with respect to the AGC amplifiers disposed at front and rear ends of the I-side channel filter 10 and the Q-side channel filter 11.

More specifically, the control section (not shown) for updating the reference value held in each reference value register or internal register values for determining the response characteristic of each AGC control section or controlling the function block 27 acquires quality information of the received signal, such as a BER (bit error rate) of the received signal, the SNR, and a constellation of a signal, and calculates a mean value of quality information of the received signal.

If a BER is bad while the mean value of the BER is equal to or less than the reference value 'Ref4', and if a SNR is poor while the SNR is equal to or less than the reference value 'Ref5', it is determined that the bad BER is derived from an insufficient SNR, so that an output signal level of the AGC amplifier c 4 must be maximized as high as possible and the reference value 'Ref3' is changed.

More specifically, if the control voltage ('V3_I terminal' signal) output from the AGC control section c 20 is equal to or less than the control voltage ('V1_I terminal' signal) output from the AGC control section a 23, and simultaneously if the control voltage ('V1_I terminal' signal) output from the AGC control section a 23 or the RSSI signal calculated from the AGC response control section 26 is equal to or greater than the reference value 'Ref6', the reference value 'Ref3' is increased in order to raise the output signal level of the AGC amplifier c 4.

In addition, if the SNR is higher than the reference value 'Ref5' under the condition that the mean value of the BER is equal to or less than the reference value 'Ref4' representing the bad BER, and the constellation is greater than the reference value 'Ref7' occurring with great distortion, it is determined that the signal distortion occurs in the AGC amplifier c 4 or in the A/D converter 5, such that the output signal level of the AGC amplifier 4 must be minimized as low as possible and the reference value 'Ref3' is changed.

More specifically, if the control voltage ('V3_I terminal' signal) output from the AGC control section c 20 is less than the control voltage ('V1_I terminal' signal) output from the AGC control section a 23, and simultaneously if the control voltage ('V1_I terminal signal) output from the AGC control section a 23 or the RSSI signal calculated from the AGC response control section 26 is less than the reference value 'Ref6', the reference value 'Ref3' is decreased in order to reduce the output signal level of the AGC amplifier c 4.

Accordingly, the gain distribution control at front and rear ends of the I-side channel filter 10 and the Q-side channel filter 11 is performed in accordance with a PAR (peak to average ratio) of the out-of-band signals and variation of a signal receiving status caused by a paging in such a manner that the signal receiving performance is prevented from deterioration caused by the signal distortion and the bad SNR, thereby effectively utilizing a limited dynamic range.

Method of Changing Gain Distribution by Using Function Block

The level distribution control for the AGC amplifiers disposed at front and rear ends of the I-side channel filter 10 and the Q-side channel filter 11 can be carried out by changing a function FN(x) according to levels of signals input into the automatic gain control device of this embodiment, i.e., according to a ratio of levels of in-band signals of the I-side channel filter 10 and the Q-side channel filter 11 to levels of out-of-band signals of the filter by using the function block 27.

More specifically, the function FN(x) may be expressed by a simple gain or as a poly-nominal equation. First, a case in which the FN(x) is the simple gain will be described.

If the function FN(x) is a simple gain, the function FN(x) satisfies the following Equations (2) or (3).

$$Y=ax \quad (2)$$

In Equation (2), 'a' is a number equal to or greater than '1'.

$$Y=x+a \quad (3)$$

In Equation (3), 'a' is a number greater than '−1' and less than '1'.

In the control section (not shown) for updating the reference value held in each reference value register or internal register values determining the response characteristic of each AGC control section or for controlling the function block 27, if there continuously occurs a status in which the control voltage ('V3_I terminal' signal) output from the AGC control section c 20 is equal to or lower than the control voltage ('V1_I terminal' signal) output from the AGC control section a 23, and simultaneously, the control voltage ('V1_I terminal' signal) output from the AGC control section a 23 or the RSSI signal calculated from the AGC response control section 26 is equal to or lower than the reference value 'Ref6', the number of such statuses is counted. In addition, if the number of such statuses per a predetermined time exceeds a predetermined number, a coefficient 'a' of the above function FN(x) is decreased.

If there continuously occurs a status in which the control voltage ('V3_I terminal' signal) output from the AGC control section c 20 is equal to or lower than the control voltage ('V1_I terminal' signal) output from the AGC control section a 23, and simultaneously, the control voltage ('V1_I terminal' signal) output from the AGC control section a 23 or the RSSI signal calculated from the AGC response control section 26 is greater than the reference value 'Ref6', the number of such statuses is counted. In addition, if the number of such statuses per a predetermined time exceeds a predetermined number, a coefficient 'a' of the above function FN(x) is increased.

In addition, if the function FN(x) is expressed by the poly-nominal equation, the function FN(x) satisfies Equation (4).

$$Y=a0+a1x+a2x^2+a3x^3 \quad (4)$$

Figure 8:
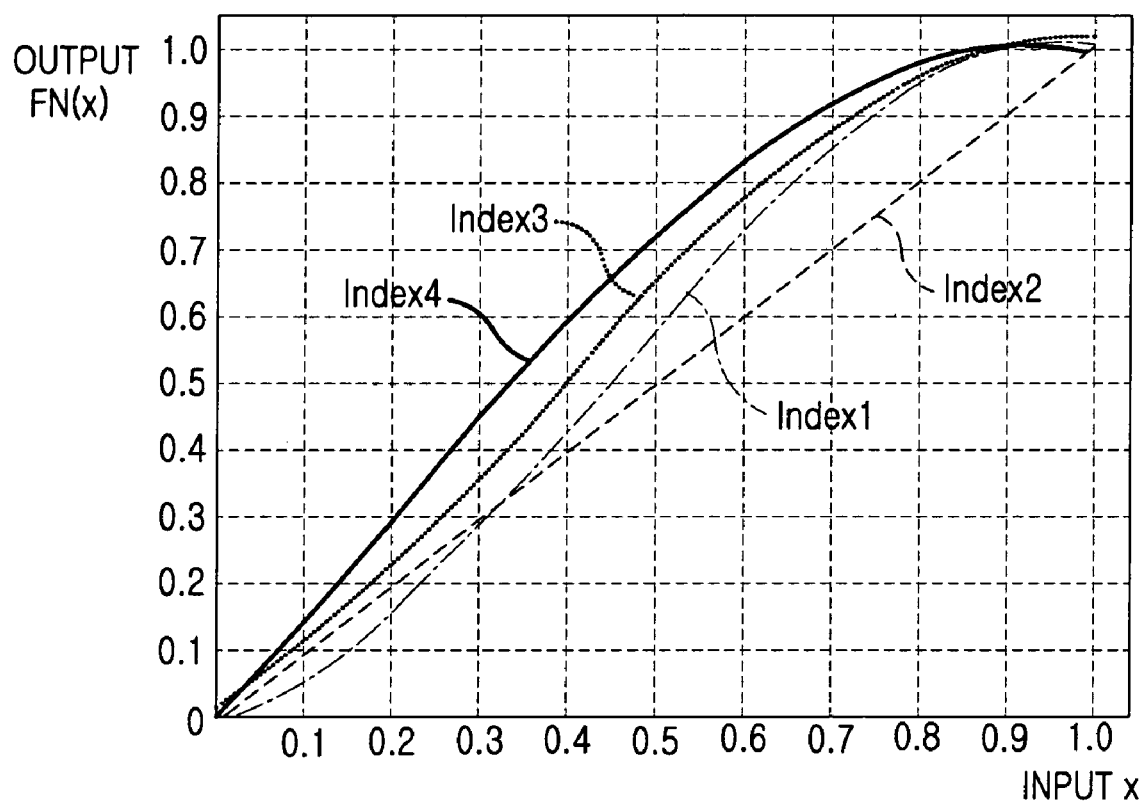
FIG. 8 is a graph illustrating an example of a function FN(x) characteristic in a function block of an AGC device according to an embodiment of the present invention.

In Equation (4), each coefficient a0 to a3 is assigned from index numbers shown in Table 1. FIG. 8 illustrates a characteristic of different functions FN(x) according to each index number.

TABLE 1

| Coefficient | Index number | | | |
|---|---|---|---|---|
| | 1 | 2 | 3 | 4 |
| a0 | −0.0094 | 0.0 | 0.0140 | −0.0048 |
| a1 | 0.4129 | 1.0 | 0.8654 | 1.4620 |
| a2 | 2.4606 | 0.0 | 1.4423 | 0.3884 |
| a3 | −1.8632 | 0.0 | −1.3112 | −0.8557 |

In the control section (not shown) controlling the function block 27 and updating the reference value of each reference value register or internal register values determining the response characteristic of each AGC control section, if there continuously occurs a status in which the control voltage ('V3_I terminal' signal) output from the AGC control section c 20 is equal to or lower than the control voltage ('V1_I terminal' signal) output from the AGC control section a 23, and simultaneously, the control voltage ('V1_I terminal' signal) output from the AGC control section a 23 or the RSSI signal calculated from the AGC response control section 26 is equal to or lower than the reference value 'Ref6', the number of such statuses is counted. In addition, if the number of such statuses per a predetermined time exceeds a predetermined number, the index number determining the coefficient of the above function FN(x) is decreased.

Also, if there continuously occurs a status in which the control voltage ('V3_I terminal' signal) output from the AGC control section c 20 is equal to or lower than the control voltage ('V1_I terminal' signal) output from the AGC control section a 23, and simultaneously, the control voltage ('V1_I terminal' signal) output from the AGC control section a 23 or the RSSI signal calculated from the AGC response control section 26 is equal to or higher than the reference value 'Ref6', the number of such statuses is counted. In addition, if the number of such statuses per a predetermined time exceeds a predetermined number, a coefficient 'a' of the above function FN(x) is increased.

Accordingly, when the input level is low, the gain of the AGC amplifier disposed at the front ends of the I-side channel filter 10 and the Q-side channel filter 11 is set to a higher level, thereby improving the SNR. In addition, if the input level is high, the gain of the AGC amplifier disposed at the front ends of the I-side channel filter 10 and the Q-side channel filter 11 is set to a lower level, thereby compensating for the distortion generated from the AGC amplifier.

In addition, in an area in which the distortion or the SNR causes a problem, the gain characteristic of the AGC amplifier disposed at the front ends of the I-side channel filter 10 and the Q-side channel filter 11 becomes smooth so that the response characteristic of the AGC amplifier becomes slow and the re-modulation distortion of the AGC loop is reduced.

Calculation of RSSI

When the gain control for the AGC amplifier c 4 is carried out using the control voltage output from the AGC control section b 25, the level of the in-band object signal of a channel filter can be detected based on the control voltage output from the AGC control section a 23 or the AGC control section b 25. In addition, when the gain control for the AGC amplifier c 4 is performed using the control voltage output from the AGC control section c 20, the gain of the AGC amplifier c 4 is decreased in accordance with a level of a non-object out-of-band signal of the channel filter. Therefore, in order to set the level of the object signal to a predetermined level, the AGC control section a 23 may increase the gains of the I-side AGC amplifier a 12 and the Q-side AGC amplifier a 13.

Accordingly, the level of the in-band target signal of the channel filter band cannot be detected from the control voltage output from the AGC control section a 23 or the AGC control section b 25. In this case, the level of the in-band signal of the target band can be obtained by compensating for an amount of gain variation of the AGC amplifier c 4 based on the control voltage output from the AGC control section a 23 or the AGC control section b 25 and the control voltage output from the AGC control section c 20.

More specifically, in the AGC response control section 26, if control signals created from the AGC control sections c 20 and b 25 are control voltages V3 and V1, and simultaneously, if an overall gain characteristic with respect to the control voltage V1 is G(V1) and a gain characteristic of front circuits of the I-side channel filter 10 and the Q-side channel filter 11 with respect to the control voltage V1 is G3(V1), the control voltage V1 becomes the strength of an in-band signal of the channel filter when the control voltage V3 is equal to or higher than the control voltage V1. In addition, when the control voltage V3 is equal to or lower than the control voltage V1, a calculating value V is obtained as the strength of the in-band signal of the channel filter and is output from the RSSI terminal according to Equation (5):

$$V=V1+(G3(V1)/G(V1))(V1-V3) \quad (5)$$

As described above, the automatic gain control device according to the first embodiment of the present invention includes the AGC amplifier c 4 disposed at front ends of the I-side channel filter 10 and the Q-side channel filter 11. In addition, the I-side AGC amplifier a 12, the Q-side AGC amplifier a 13, the I-side AGC amplifier b 15, and the Q-side AGC amplifier b 16 are disposed at rear ends of the I-side channel filter 10 and the Q-side channel filter 11.

In addition, the AGC detector c 9 detects the output signal of the AGC amplifier c 4 at the front ends of the I-side channel filter 10 and the Q-side channel filter 11, and simultaneously, the AGC detector a 14, detects the output signals of the I-side AGC amplifier a 12 and the Q-side AGC amplifier a 13 and the AGC detector b 15 detects the output signals of the I-side AGC amplifier b 15 and the Q-side AGC amplifier b 16 at the rear ends of the I-side channel filter 10 and the Q-side channel filter 11.

If out-of-band signals of the I-side channel filter 10 and the Q-side channel filter 11 are strong, the gain control for the AGC amplifier c 4 is carried out based on the control signal of the AGC control section c 20 by using the signal detected by the AGC detector c 9. In addition, if out-of-band signals of the I-side channel filter 10 and the Q-side channel filter 11 are weak, the gain control for the AGC amplifier c 4 is performed based on the control signal of the AGC control section b 25 by using the signal detected by the AGC detector b 17.

In addition, output signals of the I-side AGC amplifier a 12 and the Q-side AGC amplifier a 13 controlled by the AGC control section a 23 having a rapid response speed are utilized as output signals of the automatic gain control device. If level variation of the output signal of the AGC amplifier c 4 is stable, the control signal of the AGC control section a 23 is identical to the control signal of the AGC control section b 25.

Accordingly, the automatic gain control device according to the present invention can properly carry out the automatic gain control in accordance with the variation of the out-of-band signals of the channel filter extracting the target signal, effectively utilize a limited dynamic range, and prevent signal saturation at the front end of the channel filter. In addition, if the signal variation is very small at the front end of the channel filter, the response speed of the AGC amplifier disposed at the rear end of the channel filter becomes slow, such that the target signal is prevented from distortion caused by the rapid AGC response.

In addition, when a gain control of the AGC amplifier c 4 is performed based on a control signal output from the AGC control section b 25, control information of the AGC control section b 25 is copies into the AGC control section c 20, such that the AGC control section c 20 suppresses its operations of controlling output signals of the AGC amplifier c 4, which is not controlled from the AGC control section c 20, and the AGC response control section 26 can easily switch a gain control of the AGC amplifier c 4 from a control using the control voltage output from the AGC control section b 25 to a control by means of the control voltage output from the AGC control section c 20. Consequently, even if a response characteristic of the AGC device with respect to variations of input signals is not excessively rapid, response compliance to the variations of the input signals can be improved.

Accordingly, disturbances of in-band signals of the filter due to out-band signals of the filter can be reduced. That is, a distortion is reduced, which occurs when a status of no outof-band signals of the filter or weaker out-of-band signals of the filter than in-band signals of the filter shifts to a status of stronger out-of-band signals of the filter than in-band signals of the filter. In addition, there is no need that response characteristic of the AGC device is unnecessarily rapid so as to cover a control delay. Additionally, because response compliance is improved even if the response characteristic is slow, a signal distortion which occurs until a rapid response characteristic is converged according to signal variations can be suppressed.

Figure 9:
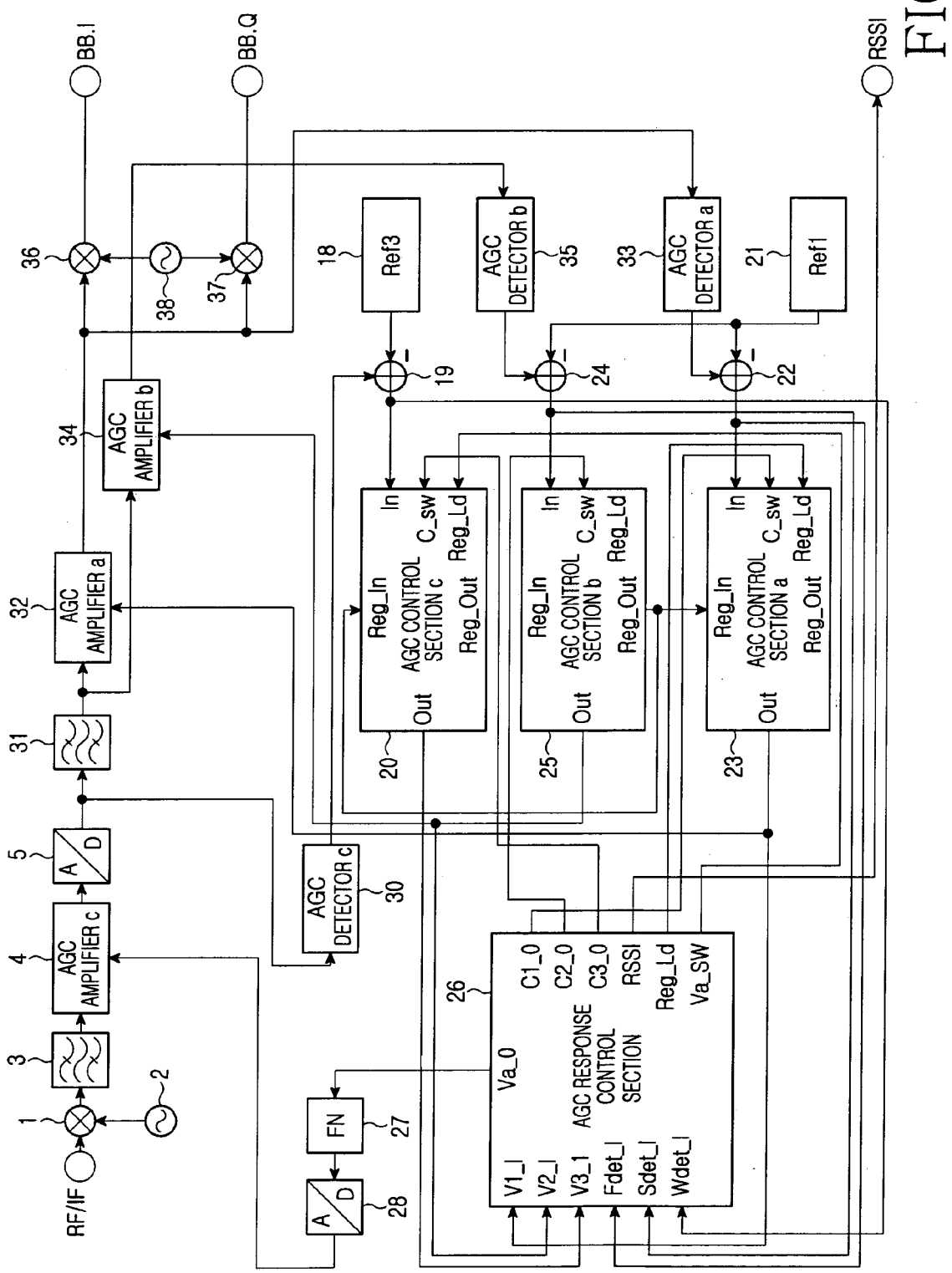
FIG. 9 is a block diagram illustrating a wireless apparatus having an AGC device in accordance with an embodiment of the present invention.

FIG. 9 is a block diagram illustrating a wireless apparatus having an automatic gain control device according to an embodiment of the present invention. The automatic gain control device according to this embodiment is different from the AGC device described above in that the AGC device described above performs an orthogonal detection for a signal received in the front end of the channel filter extracting the target signal, and the AGC device, which will be described below, performs the orthogonal detection for a signal received in the channel filter and for a signal received rearward of the AGC amplifier disposed at the rear end of the channel filter, and the AGC detection performed with an absolute value of a real signal.

In FIG. 9, the parts having the same reference numerals as the parts of FIG. 1 have the same functions and structures as those of the parts shown in FIG. 1. Accordingly, as they have already been described above, they will not be described herein below.

In addition, according to the AGC device of the present invention, if an IF frequency of a received signal is lower than a half of a sampling frequency Fs of the A/D converter 5, sample points per one period of a signal are densely formed, such that a level detection error caused by a differential phase condition between the signal and the sample points will be reduced.

More specifically, referring to FIG. 9, the signal input into the mixer 1 from the RF/IF terminal is converted into a signal having a low frequency (input IF frequency of the A/D converter 5) in the mixer 1 by using a local signal having a first frequency, which is output from a local oscillator 2. A signal having a predetermined frequency band is extracted from the signal output from the mixer 1 using a bandpass filter 3.

An AGC amplifier c 4 is a variable gain amplifier for converting an output signal of the bandpass filter 3 into a signal having a constant level. The signal having the predetermined frequency band, which is converted into the signal having the constant level by the AGC amplifier c 4, is input into the A/D converter 5, such that the signal is converted into a quantized digital signal using the A/D converter 5.

The quantized digital signal having an IF frequency is input into an AGC detector c 30 and converted into a band signal of a target band due to the band of the quantizing digital signal being limited by a channel filter 31, and simultaneously, is input into an AGC amplifier a 32. In order to create a gain control signal for the AGC amplifier c 4, the AGC detector c 30 calculates an absolute value of the input IF frequency signal and integrates the absolute value, thereby detecting variation of an output signal of the A/D converter 5.

In addition, the AGC amplifier a 32 is a variable gain amplifier for converting an output signal of the channel filter 31 into a signal having a constant level. The band signal of the target band, which is converted into the signal having the constant level by the AGC amplifier a 32, is subject to an orthogonal detection. The orthogonal detection is performed using a local signal (I-side: cosine wave, Q-side: -sine wave) having a second frequency output from a digital local oscillator 38 of an I-side mixer 36 and a Q-side mixer 37 and is converted into a complex number signal having a baseband frequency represented by an I-axis signal and a Q-axis signal. In addition, the signal is output from the wireless apparatus as complex number signals BB.I and BB.Q having baseband frequencies.

In addition, the band signal of the target band, which is converted into the signal having the constant level by the AGC amplifier a 32, is input into an AGC detector a 33. In order to create a gain control signal for the AGC amplifier a 32, the AGC detector a 33 calculates an absolute value of the input band signal of the target band and integrates the absolute value, thereby detecting variation of an output signal of the AGC amplifier a 32.

Similarly, the signal converted into the band signal of the target band and band-limited by the channel filter 31 is input into an AGC amplifier b 34. The AGC amplifier b 34 is a variable gain amplifier for converting an output signal of the channel filter 31 into a signal having a constant level. The band signal of the target band, which is converted into the signal having the constant level by the AGC amplifier b 34, is input into an AGC detector b 35.

In order to create a gain control signal for the AGC amplifier b 34, the AGC detector b 35 calculates an absolute value of the input band signal of the target band and integrates the absolute value, thereby detecting variation of an output signal of the AGC amplifier b 34.

The AGC detector c 30, the AGC detector a 33, and the AGC detector b 35 will be described in more detail later.

In order to create signals for controlling the gain of each AGC amplifier, output signals of the AGC detector c 30, the AGC detector a 33, and the AGC detector b 35 are input into an AGC control section creating a gain control signal for each AGC amplifier that is, a reference value 'Ref3' output from a reference value register 18 is subtracted from an output signal of the AGC detector c 30 using a subtractor 19 and the resultant value is input into an 'In terminal' of an AGC control section c 20.

In addition, a reference value 'Ref1' output from a reference value register 21 is subtracted from an output signal of the AGC detector a 33 using a subtractor 22, and the resultant value is input into an 'In terminal' of an AGC control section a 23. Further, the reference value 'Ref1' output from the reference value register 21 is subtracted from an output signal of the AGC detector b 35 using a subtractor 24 and the resultant value is input into an 'In terminal' of an AGC control section b 25 having response characteristic lower than response characteristic of the AGC control section a 23.

Other connection structures of the AGC device according to an embodiment of the present invention are similar to those of the AGC device described above, so they will not be described herein.

AGC Detector

Hereinafter, AGC detector c 30, AGC detector a 33, and AGC detector b 35 of the AGC device according to an embodiment will be described in detail with reference to accompanying drawings. The AGC detector c 30, the AGC detector a 33, and the AGC detector b 35 have the same structure with each other.

Figure 10:
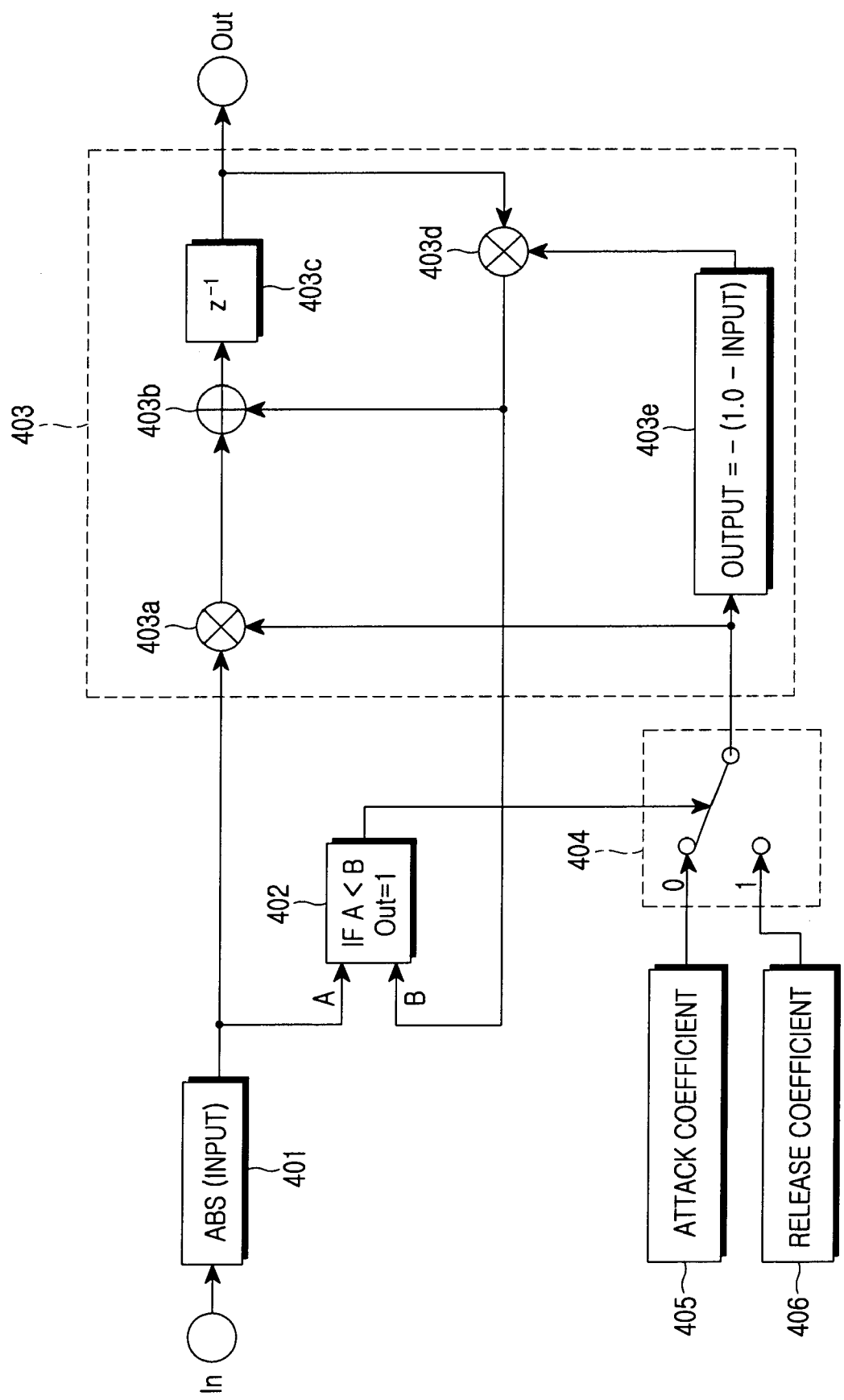
FIG. 10 is a block diagram illustrating an AGC detector (real input type) of the AGC device according to an embodiment of the present invention.

FIG. 10 illustrates an AGC detector (real input type). Referring to FIG. 10, as a signal is input through an 'In terminal', an absolute value calculator 401 calculates an absolute value of the signal. An output signal of the absolute value calculator 401 is simultaneously input into a comparator 402 and an integrator 403 including a multiplier 403a, an adder 403b, a delay unit 403c, a multiplier 403d, and a coefficient calculator 403e.

Here, the integrator 403 is designed to integrate the output signal of the absolute value calculator 401 based on any one of an attack coefficient output from an attack coefficient register 406 and a release coefficient output from a release coefficient register 405 (provided that an attack coefficient value is larger than a release coefficient value), which are selected by a switch 404 that is controlled using an output signal of the comparator 402. More specifically, the output signal of the absolute value calculator 401 input into the integrator 403 is multiplied by any one of the attack coefficient and the release coefficient, which are input into the integrator 403 as numerator coefficients, by means of the multiplier 403a.

In addition, a denominator coefficient of the attack coefficient or the release coefficient input into the integrator 403 is calculated using the coefficient calculator 403e. An output signal of the coefficient calculator 403e is multiplied by an output signal of the integrator 403 through the multiplier 403d and the result thereof is added to an output signal of the multiplier 403a using the adder 403b. Also, an output signal of the adder 403b is output through an 'Out terminal' via the delay unit 403c as an output signal of the integrator 403, i.e., as an output signal of the AGC detector.

The comparator 402 compares the output signal of the absolute value calculator 401 with an output signal of the multiplier 403d. If the output signal of the absolute value calculator 401 is smaller than the output signal of the multiplier 403d, the switch 404 selects the release coefficient such that an integration time constant is enlarged. If the output signal of the absolute value calculator 401 is larger than the output signal of the multiplier 403d, the switch 404 selects the attack coefficient such that the integration time constant is reduced. Therefore, the output signal level of the integrator 403 may be between an effective value and a peak value of an input signal. In addition, the attack coefficient value is larger than the release coefficient value. As a differential value between the attack coefficient value and the release coefficient value becomes large, the output signal of the integrator 403 may be close to the peak value.

In addition, an orthogonal detector may extract an envelope of a received signal using an analog mixer.

The AGC detector c 30 may rectify a signal using a diode and can detect a level of the received signal.

As described above, the AGC device according to an embodiment performs the orthogonal detection for a signal received in the channel filter and for a signal received rearward of the AGC amplifier disposed at the rear end of the channel filter. Therefore, the envelope of the signal can be obtained by calculating the absolute value of the signal using the AGC detector c 30.

In addition, the AGC device can properly perform the AGC in accordance with variations of the out-of-band signals of the channel filter extracting the target signal, and can effectively utilize a limited dynamic range. In order to restrict the level variation in the AGC detector c 30, it is necessary to enlarge a ratio of the sampling frequency to a signal frequency.

Figure 11:
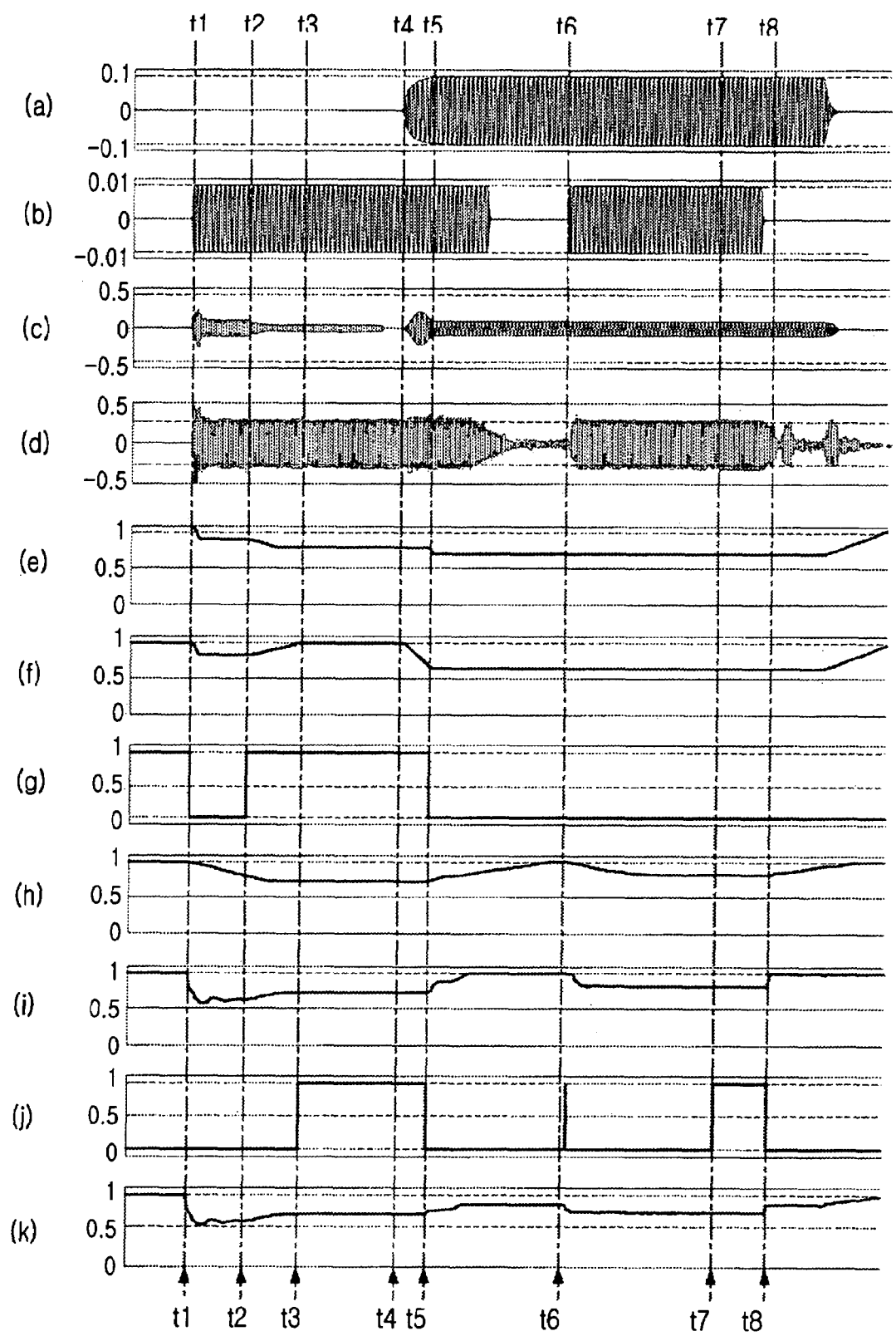
FIG. 11 is a graph illustrating a response waveform in each part of the AGC device according to an embodiment of the present invention when the AGC device is not operated to copy control information from a Reg_Out terminal of an AGC control section b into a Reg_In terminal of an AGC control section c.
Figure 12:
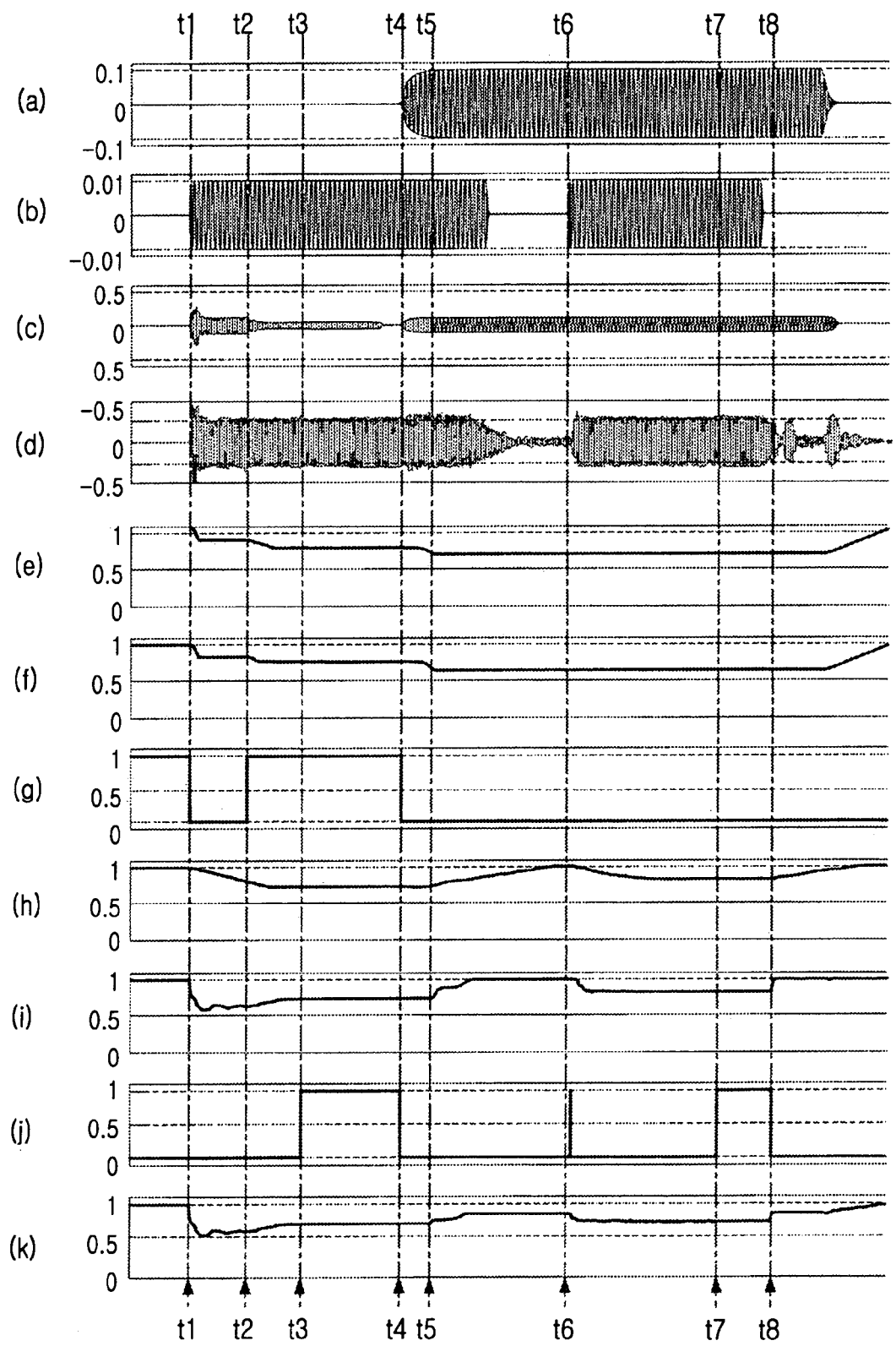
FIG. 12 is a graph illustrating a response waveform in each part of the AGC device according to an embodiment of the present invention when the AGC device is operated to copy control information from the Reg_Out terminal of the AGC control section b into the Reg_In terminal of the AGC control section c.

In order to describe in detail a function (corresponding to reference information copier means in claims) of copying control information from the Reg_Out terminal of the AGC control section b 25 into the Reg_In terminal of the AGC control section c 20, FIG. 11 illustrates an example of a response waveform in each part of the automatic gain control device when the automatic gain control device is not operated to copy control information from the Reg_Out terminal of the AGC control section b 25 into the Reg_In terminal of the AGC control section c 20, and FIG. 12 illustrates a response waveform in each part of the automatic gain control device when the automatic gain control device is operated to copy control information from the Reg_Out terminal of the AGC control section b 25 into the Reg_In terminal of the AGC control section c 20.

Similarly, in order to compare characteristics between the above two cases, quality information of a received signal, i.e., a BER characteristic is measured in a signal demodulation section connected to the rear end of the AGC device according to this embodiment.

Figure 13:
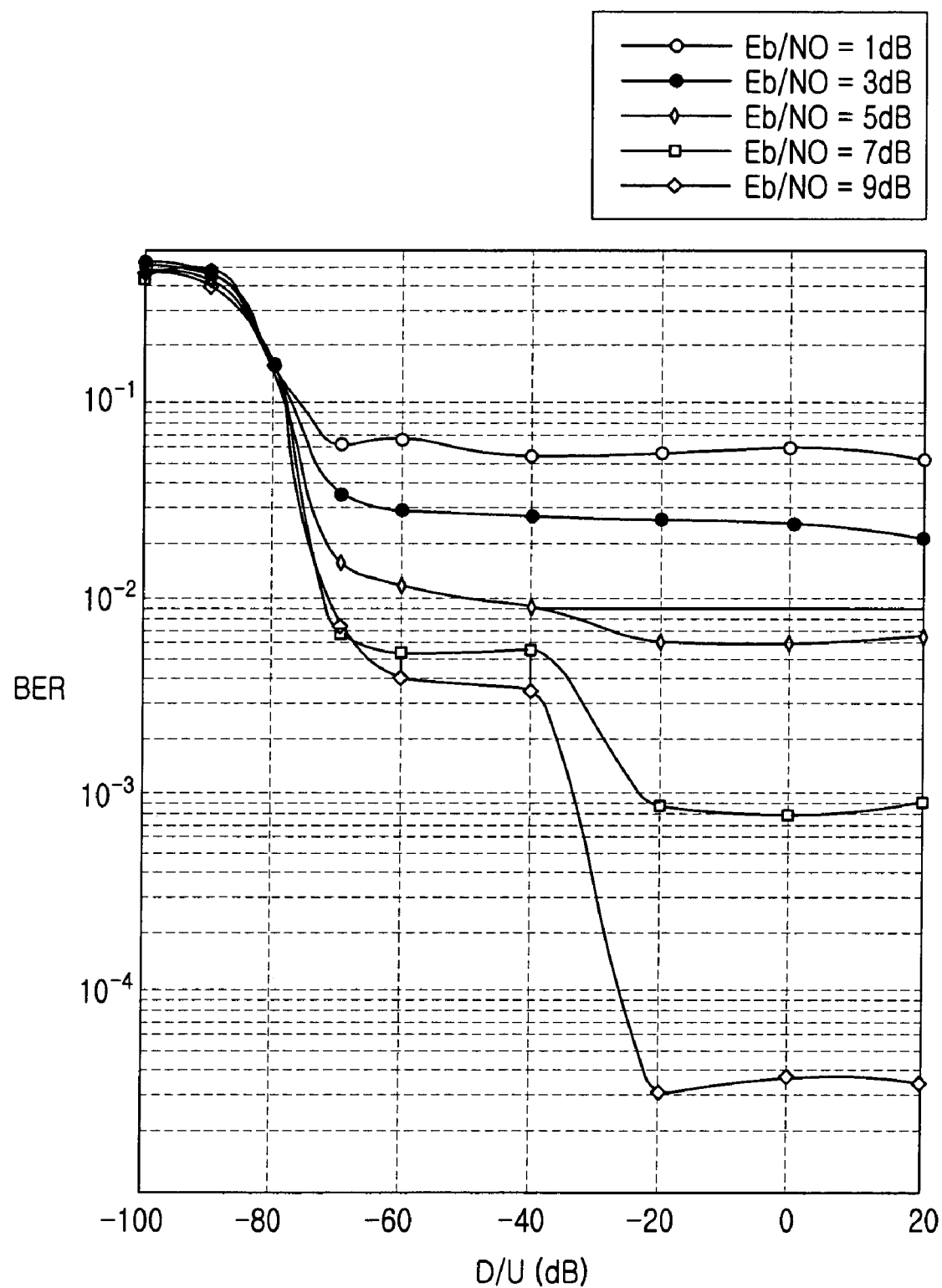
FIG. 13 is a graph illustrating a BER characteristic of the AGC device according to an embodiment of the present invention when the AGC device is not operated to copy control information from the Reg_Out terminal of the AGC control section b into the Reg_In terminal of the AGC control section c.
Figure 14:
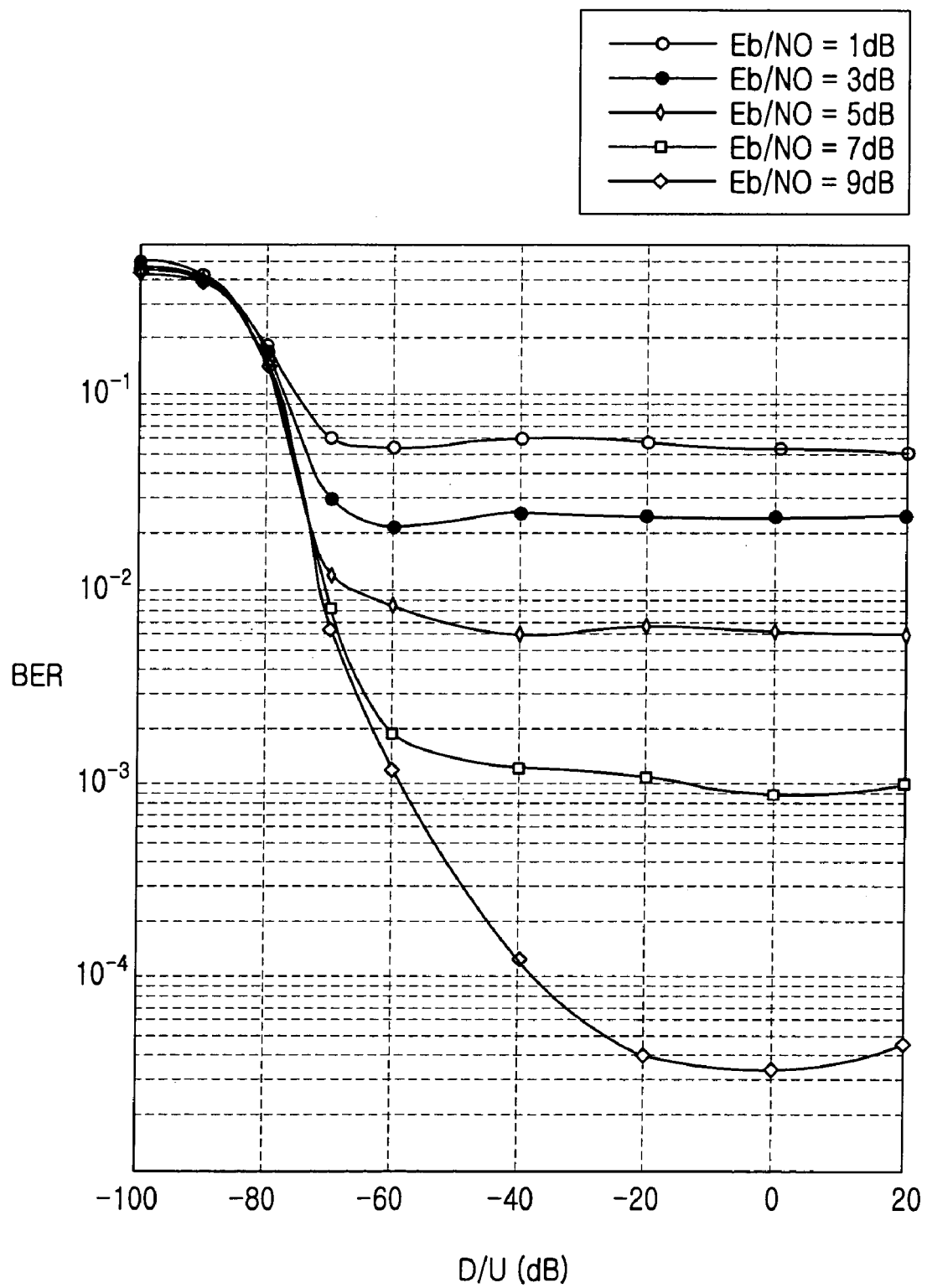
FIG. 14 is a graph illustrating a BER characteristic of the AGC device according to an embodiment of the present invention when the AGC device is operated to copy control information from the Reg_Out terminal of the AGC control section b into the Reg_In terminal of the AGC control section c.

FIG. 13 illustrates a BER characteristic of the AGC device according to an embodiment of the present invention when the AGC device is not operated to copy control information from the Reg_Out terminal of the AGC control section b 25 into the Reg_In terminal of the AGC control section c 20, and FIG. 14 illustrates a BER characteristic of the AGC device according to an embodiment of the present invention when the AGC device is operated to copy control information from the Reg_Out terminal of the AGC control section b 25 into the Reg_In terminal of the AGC control section c 20.

In addition, the BER characteristics illustrated in FIGS. 13 and 14 is represented under the condition that a π/4QPSK (Quadrature Phase Shift Keying) signal is input into an out-of-band signal of the channel filter 31 and a burst CW (Continuous Wave) signal is input into an in-band signal of the channel filter 31, and Eb/NO is set with respect to parameters and a Desired-to-Undesired signal power (D/U) ratio and a BER are assigned to transverse and longitudinal axes, respectively.

In FIGS. 11 and 12, (a) represents an out-of-band signal of channel filter 31, (b) represents an in-band signal of channel filter 31, (c) represents an output signal of A/D converter 5, (d) represents an output signal of an automatic gain control device, (e) represents a 'Va_O terminal' output signal of AGC response control section 26, (f) represents an 'Out terminal' output signal of AGC control section c 20, (g) represents a 'Va_SW terminal' output signal of AGC response control section 26, (h) represents an 'Out terminal' output signal of AGC control section b 25, (i) represents an 'Out terminal' output signal of AGC control section a 23, (j) represents a 'Reg_Ld terminal' output signal of AGC response control section 26, and (k) represents a 'RSSI terminal' output signal of AGC response control section 26.

As illustrated in FIG. 11, when the automatic gain control device is not operated to copy control information from the Reg_Out terminal of the AGC control section b 25 into the Reg_In terminal of the AGC control section c 20, if an in-band signal of the channel filter 31 (b) is input at time t1, the 'Out terminal' output signal of the AGC control section c 20 (f) is output once through a 'Va_O terminal' of the AGC response control section 26 (e) using the 'Va_SW terminal' output signal of the AGC response control section 26 (g) because the response characteristic of the AGC control section b 25 is slower than that of the AGC control section c 20. However, because the out-of-band signal of the channel filter 31 (a) has not been input, the 'Out terminal' output signal of the AGC control section b 25 (h) is directly output through the 'Va_O terminal' of the AGC response control section 26 (e) at time t2 in which the AGC control section b 25 follows the response of the AGC control section c 20.

In addition, when the output signal of the A/D converter 5 (c) has been stabilized, control information of the AGC control section b 25 is copied in the AGC control section a 23 at time t3 by means of a 'Reg_Ld terminal' output signal of the AGC response control section 26 (j). Accordingly, the 'Out terminal' output signal of the AGC control section b 25 (h) represents the response characteristic identical to the response characteristic of the 'Out terminal' output signal of the AGC control section a 23 (i).

In addition, as the out-of-band signal of the channel filter 31 (a) is input at time t4, the 'Out terminal' output signal of the AGC control section c 20 (f) is output through the 'Va_O terminal' of the AGC response control section 26 (e) using the 'Va_SW terminal' output signal of the AGC response control section 26 (g).

At this time, because the "Out terminal" output signal of the AGC control section b 25 having a slower response characteristic than that of the AGC control section c 20 controls the AGC amplifier c 4 from time t4 to time t5, the AGC amplifier c 4 cannot fully respond to the inputting of the out-of-band signal of the channel filter 31 (a) and thus distortion occurs in the output signal of the A/D converter (c).

In addition, the signal output from the "Va_O terminal' of the AGC response control section 26 (e) is switched from the "Out terminal' output signal of the AGC control section b 25 (h) to the "Out terminal' output signal of the AGC control section c 20 (f) at time 5 behind the inputting of the out-of-band signal of the channel filter 31 (a) at time 4 because, for example, when a predetermined target level of the AGC control section c 20 is different from the output of the AGC amplifier c 4, the AGC control section c 20 attempting to control the output signal of the AGC amplifier c 4, which is not controlled from the AGC control section c 20, changes its 'Out terminal' output signal to a maximum value and the 'Out terminal' output signal is quite different from a proper gain control value, such that the AGC response control section 26 cannot directly switch the 'Va_O terminal' output signal from the "Out terminal' output signal of the AGC control section b 25 (h) to the "Out terminal' output signal of the AGC control section c 20 (f).

At time t6, because the out-of-band signal of the channel filter 31 (a), which has a level stronger than that of the in-band signal, has been already input, the 'Va_SW terminal' output signal of the AGC response control section 26 (g) does not vary even if the in-band signal of the channel filter 31 (b) is input. The output signal of the AGC device includes the in-band signal of the channel filter 31 (b). Although the out-of-band signal of the channel filter 31 (a) has been already input, if the output signal of the A/D converter 5 (c) is stabilized, control information of the AGC control section b 25 can be copied into the AGC control section a 23 at time t7 by means of the 'Reg_Ld terminal' output signal of the AGC response control section 26. Thus, the 'Out terminal' output signal of the AGC control section b 25 (h) represents the response characteristic identical to that of the 'Out terminal' output signal of the AGC control section a 23 (i).

In addition, at time t8, the AGC control section a 23 operates separately from the AGC control section b 25 in order to rapidly increase the gain of the AGC amplifier a 32 to match with the stop of the in-band signal of the channel filter 31 (b).

In contrast with this, as illustrated in FIG. 12, when the AGC device is operated to copy control information from the Reg_Out terminal of the AGC control section b 25 into the Reg_In terminal of the AGC control section c 20, if an in-band signal of the channel filter 31 (b) is input at time t1, the 'Out terminal' output signal of the AGC control section c 20 (f) is output once through a 'Va_O terminal' of the AGC response control section 26 (e) using the 'Va_SW terminal' output signal of the AGC response control section 26 (g) because the response characteristic of the AGC control section b 25 is slower than that of the AGC control section c 20. However, because the out-of-band signal of the channel filter 31 (a) has not been input, the 'Out terminal' output signal of the AGC control section b 25 (h) is directly output through the 'Va_O terminal' of the AGC response control section 26 (e) at time t2 in which the AGC control section b 25 follows the response of the AGC control section c 20.

Also, control information of the AGC control section b 25 is copied into the AGC control section c 20 at time t2 by means of the "Va_SW terminal' output signal of the AGC response control section 26, such that the 'Out terminal' output signal of the AGC control section b 25 (h) represents the response characteristic identical to that of the 'Out terminal' output signal of the AGC control section c 20 (f).

In addition, when the output signal of the A/D converter 5 (c) has been stabilized, control information of the AGC control section b 25 is copied in the AGC control section a 23 at time t3 by means of a 'Reg_Ld terminal' output signal of the AGC response control section 26 (j). Therefore, the 'Out terminal' output signal of the AGC control section b 25 (h) represents the response characteristic identical to the response characteristic of the 'Out terminal' output signal of the AGC control section a 23 (i).

As the out-of-band signal of the channel filter 31 (a) is input at time t4, the 'Out terminal' output signal of the AGC control section c 20 (f) is output through the 'Va_O terminal' of the AGC response control section 26 (e) using the 'Va_SW terminal' output signal of the AGC response control section 26 (g).

Therefore, because the 'Out terminal" output signal of the AGC control section c 20 having a slower response characteristic than that of the AGC control section b 25 controls the AGC amplifier c 4 from time t4, the AGC amplifier c 4 can fully respond to the inputting of the out-of-band signal of the channel filter 31 (a) and thus no distortion occurs in the output signal of the A/D converter (c).

In addition, the signal output from the "Va_O terminal' of the AGC response control section 26 (e) is directly switched from the "Out terminal' output signal of the AGC control section b 25 (h) to the "Out terminal' output signal of the AGC control section c 20 (f) at time 4 to match with the inputting of the out-of-band signal of the channel filter 31 (a) at time 4. This is because the control information of the AGC control section b 25 is copied into the AGC control section c 20 and the 'Out terminal' output signal of the AGC control section b 25 (h) represents the response characteristic identical to that of the 'Out terminal' output signal of the AGC control section c 20 (f), such that the AGC response control section 26 can directly switch the 'Va_O terminal' output signal from the "Out terminal' output signal of the AGC control section b 25 (h) to the "Out terminal' output signal of the AGC control section c 20 (f).

Operations after t6 in FIG. 12 are the same as those in FIG. 11, so they will not be described herein.

Next, the BER characteristic shown in FIG. 13 will be compared with that shown in FIG. 14. For example, when a π/4QPSK signal is used in an in-band signal of the channel filter 31, information is superimposed with envelope variation of the signal, such that a signal distortion occurs to deteriorate the BER characteristic unless a response characteristic of the automatic gain control device is slowed. In particular, a response characteristic of the AGC control section b 25 is slowed.

Referring to FIG. 13, when the AGC device is not operated to copy control information from the Reg_Out terminal of the AGC control section b 25 into the Reg_In terminal of the AGC control section c 20, the BER characteristic deteriorates, in particular, under the influence of the out-of-band signal of the channel filter 31, a D/U ratio of which varies in a burst manner near a range between −60 [dB] to −40 [dB] due to, for example, a distortion of the output signal of the A/D converter 5, during a time of t4 to t5 in FIG. 11, even if a level of the output signals of the AGC device is constant.

However, as illustrated in FIG. 14, when the AGC device is operated to copy control information from the Reg_Out terminal of the AGC control section b 25 into the Reg_In terminal of the AGC control section c 20, no distortion occurs in the output signal of the A/D converter 5 irrespective of a status of a input signal as illustrated in FIG. 12, such that the BER characteristic improves.

As described above, in the embodiments of the present invention, in which any one of a control voltage output from the AGC control section c 20 and a control voltage output from the AGC control section b 25 is selected and output to the AGC amplifier c 4, the influence exerted by out-of-band signals of the filter on in-band signals of the filter can be reduced by selecting whether the AGC amplifier c 4 is controlled based on variation of a signal input into the filter or based on variation of a signal output from the filter. When the control voltage of the AGC control section b 25 is selected as the control voltage of the AGC amplifier c 4, control information of the AGC control section b 25 is copied into the AGC control section c 20 to approximate the control voltage output from the AGC control section c 20 to the control voltage output from the AGC control section b 25, such that the AGC response control section 26 can directly switch the 'Va_O terminal' output signal from the control voltage output from the AGC control section b 25 to the control voltage output from the AGC control section c 20.

In addition, when the control voltage of the AGC control section b 25 is also selected as the control voltage of the AGC amplifier c 4, control information of the AGC control section b 25 is copied into the AGC control section a 23, if level variation of output signal of the AGC amplifier c 4, so as to equalize a control voltage output from the AGC control section a 23 to the control voltage output from the AGC control section b 25. A response speed of the AGC amplifier disposed at a rear end of the filter is slowed if signal variation at a froe end of the filter is low. Consequently, irrespective of a status of a received signal, a stable output of the A/D converter and a stable output of the automatic gain control device can be obtained, and distortion occurrence in the output signals of the A/D converter and the automatic gain control device can be prevented. This principle is also applied to AGC devices according to other embodiments of the present invention to be described below, which produce the same effect.

Figure 15:
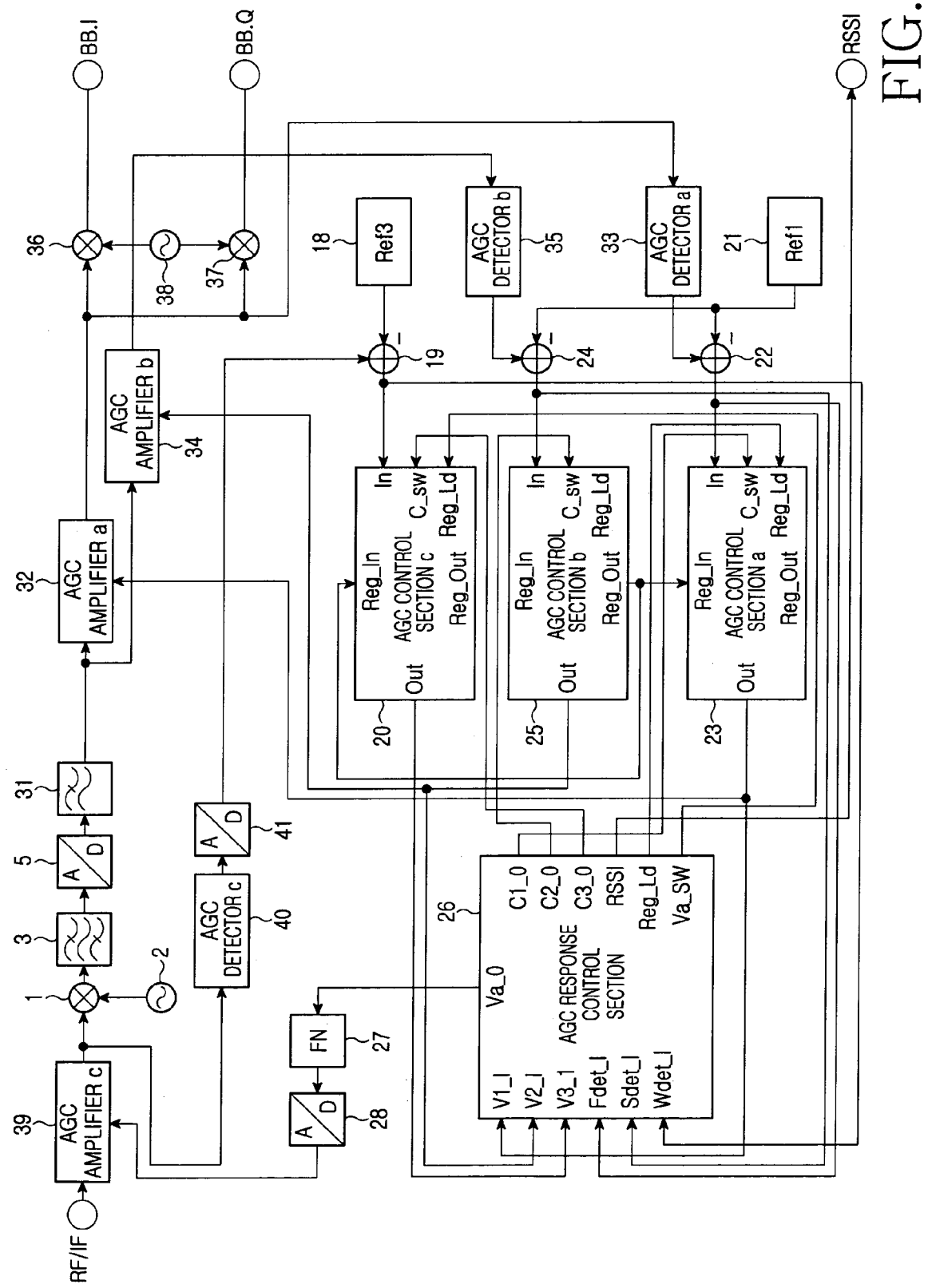
FIG. 15 is a block diagram illustrating a wireless apparatus having an AGC device in accordance with an embodiment of the present invention.

FIG. 15 is a block diagram illustrating a wireless apparatus having an AGC device according to an embodiment of the present invention. This AGC device is different from the AGC devices described above in that the AGC device described above performs the gain control for the AGC amplifier, which is disposed at the front end of the channel filter extracting the target signal, in an IF frequency band rearward of the mixer, and the AGC device according to this embodiment performs the gain control in an RF/IF frequency band forward of the mixer.

In FIG. 15, the components having the same reference numerals as in FIG. 9 have the same functions and structures as those of the parts shown in FIG. 9, so they will not be described herein.

Referring to FIG. 15, a signal input from an RF/IF terminal is input into an AGC amplifier c 39. A gain control for the AGC amplifier c 39 is performed using an output signal of a D/A converter 28. The AGC amplifier c 39 is a variable gain amplifier for setting a level of an input signal input into a mixer 1 to a predetermined range. The input signal, which is converted into the signal having the predetermined level by the AGC amplifier c 39, is input into the mixer 1. The input signal is converted into a signal having a low frequency (input IF frequency of the A/D converter 5 disposed at a rear end) in the mixer 1 using a local signal having a first frequency, which is output from a local oscillator 2. A signal having a predetermined frequency band is extracted from the signal output from the mixer 1 using a bandpass filter 3.

For example, the AGC amplifier c 39 can be realized by varying an attenuation degree of a pin diode by restricting voltage applied to the pin diode.

In addition, the input signal, which is converted into the signal having a predetermined level by the AGC amplifier c 39, is input into an AGC detector c 40. In order to create a gain control signal for the AGC amplifier c 39, the AGC detector c 40 detects variation of an output signal of the AGC amplifier c 39 by rectifying the output signal of the AGC amplifier c 39 through a diode. Because the AGC detector c 40 creates the gain control signal for the AGC amplifier c 39, the output signal of the AGC detector c 40 is quantized and converted into a digital signal through an A/D converter 41. A reference value Ref3 output from a reference value register 18 is subtracted from the output signal of the AGC detector c 40 in a subtractor 19 and the resultant value is input into an 'In terminal' of the AGC control section c 20.

Other connection structures of the AGC device according to this embodiment of the present invention are similar to those of the AGC devices described above, so they will not be described herein.

As described above, the AGC device according to the present invention performs the gain control at the front end of the channel filter extracting the target signal in the RF frequency band. Therefore, as the same as the AGC device described above, the AGC device in FIG. 15 can properly perform the AGC to match with variations of the out-of-band signal of the channel filter extracting the target signal. In addition, the AGC device can effectively utilize a limited dynamic range and can prevent signal saturation at the front end of the channel filter while restricting signal distortion in the RF frequency band. In a case of a receiver, in which the IF frequency is not converted into a digital signal, the signal distortion can be reduced at the front end of the channel filter.

Figure 16:
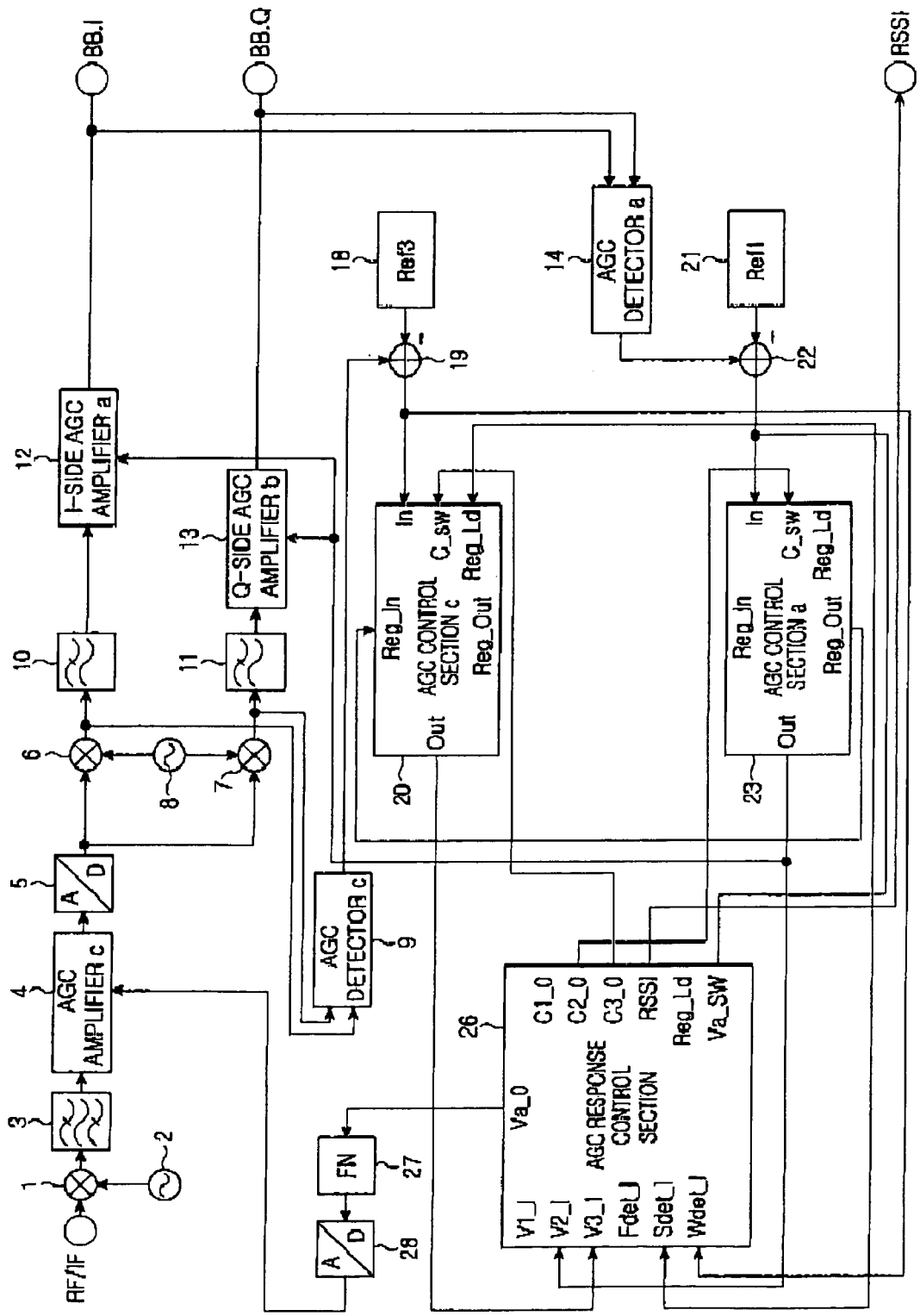
FIG. 16 is a block diagram illustrating a wireless apparatus having an AGC device in accordance with an embodiment of the present invention.

FIG. 16 is a block diagram illustrating a wireless apparatus having an AGC according to another embodiment of the present invention. The AGC device according to this embodiment is different from the AGC device in FIG. 1, in that the AGC device in FIG. 1 includes the first AGC loop and the second AGC loop at rear ends of the I-side channel filter 10 and the Q-side channel filter 11, and an output signal of the AGC device is extracted from the first AGC loop, in which the first AGC loop has the I-side AGC amplifier a 12, the Q-side AGC amplifier a 13, the AGC detector a 14, and the AGC control section a 23 and performs a high-speed response. The second AGC loop has the I-side AGC amplifier b 15, the Q-side AGC amplifier b 16, the AGC detector b 17 and the AGC control section b 25 and performs a low-speed response with a low signal distortion. However, the AGC device according to this embodiment does not have a second AGC loop including the I-side AGC amplifier b 15, the Q-side AGC amplifier b 16, the AGC detector b 17 and the AGC control section b 25.

More specifically, referring to FIG. 16, the I-side AGC amplifier b 15, the Q-side AGC amplifier b 16, the AGC detector b 17 and the AGC control section b 25 explained in connection with FIG. 1 are omitted. In addition, the output signal of the AGC control section a 23 is not input into the 'V1_I terminal', but input into the 'V2-I terminal' of the AGC response control section 26. Also, the 'Reg-Out terminal' of the AGC control section a 23 is connected to the 'Reg_in terminal' of the AGC control section c 20. Furthermore, the time constant of response characteristic of the AGC control section a 23 in the AGC device in FIG. 16 is identical to the time constant of the response characteristic of the AGC control section b 25 in the AGC device illustrated in FIG. 1.

As described above, the AGC device illustrated in FIG. 16 omits the second AGC loop including the I-side AGC amplifier b 15, the Q-side AGC amplifier b 16, the AGC detector b 17 and the AGC control section b 25, which are provided in the AGC device illustrated in FIG. 1. Therefore, same as the AGC device illustrated in FIG. 1, the AGC device according illustrated in FIG. 16 can properly perform the AGC to match with variations of the out-of-band signal of the channel filter extracting the target signal, while minimizing signal processing at the rear end of the channel filter.

In addition, the AGC device illustrated in FIG. 16 can effectively utilize a limited dynamic range and can prevent signal saturation at the front end of the channel filter.

Figure 17:
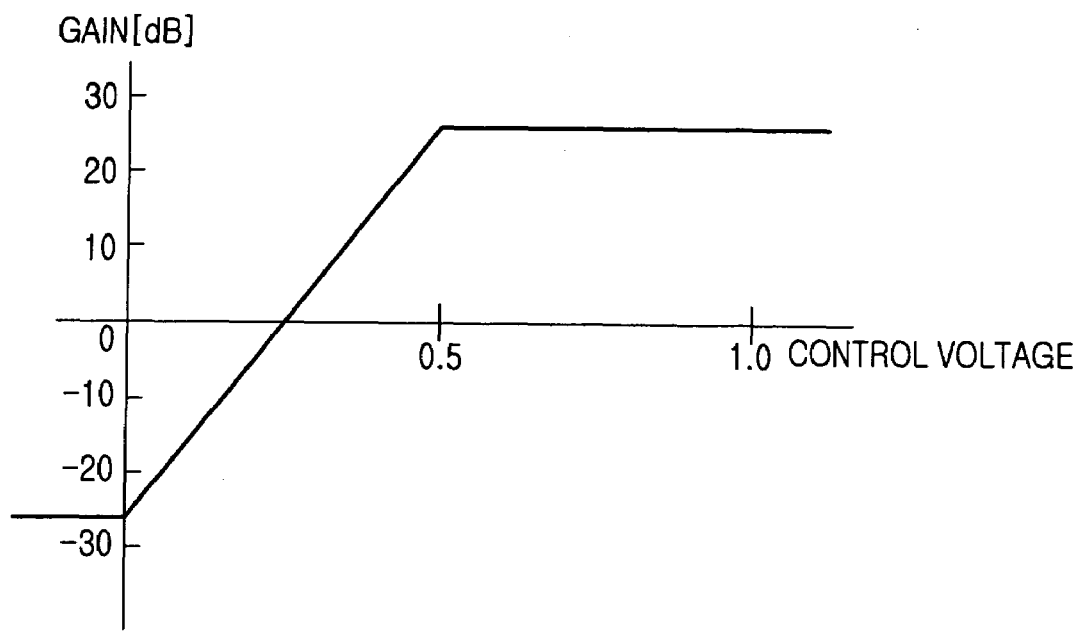
FIG. 17 is a graph illustrating a gain characteristic of an AGC amplifier as a function of control voltage when the AGC amplifier is disposed at a rear end of a channel filter of an AGC device in accordance with an embodiment of the present invention.

FIG. 17 is a graph illustrating a gain characteristic of an AGC amplifier as a function of control voltage when the AGC amplifier is disposed at the rear end of the channel filter. According to the characteristic of the AGC amplifier shown in FIG. 17, the gain is constantly maintained at −25 [dB] when the control voltage is below 0.0, and is constantly maintained at 25 [dB] when the control voltage is above 0.5. In addition, when the control voltage is in a range between 0.0 and 0.5, the gain increases by 10 [dB] as the control voltage increases by 0.1 and the gain becomes 0 [dB] when the control voltage is 0.25.

Figure 18:
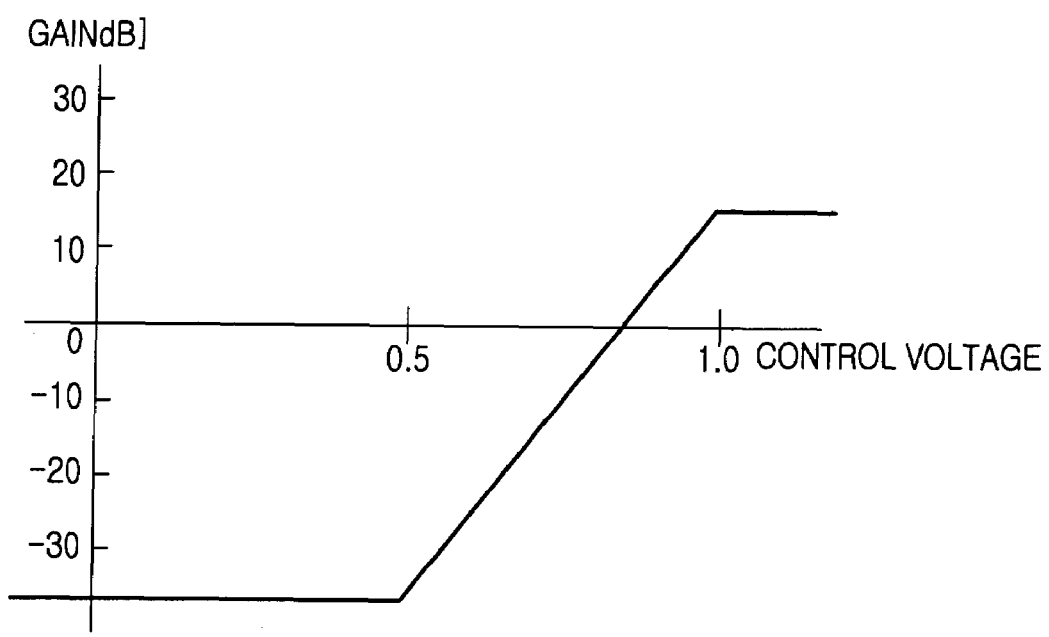
FIG. 18 is a graph illustrating a gain characteristic of an AGC amplifier as a function of control voltage when the AGC amplifier is disposed at a front end of the channel filter of the AGC device according to an embodiment of the present invention.

FIG. 18 is a graph illustrating a gain characteristic of the AGC amplifier as a function of control voltage when the AGC amplifier is disposed at the front end of the channel filter. According to the characteristic of the AGC amplifier shown in FIG. 18, the gain is constantly maintained at −35 [dB] when the control voltage is below 0.5, and is constantly maintained at 15 [dB] when the control voltage is above 1.0. In addition, when the control voltage is in a range between 0.5 and 1.0, the gain increases by 10 [dB] as the control voltage increases by 0.1 and the gain becomes 0 [dB] when the control voltage is 0.85.

If the gain characteristics of the AGC amplifiers of the present invention is set identically to the gain characteristics illustrated in FIGS. 17 and 18, it is possible to prevent the SNR from deterioration caused by an inferior NF (noise figure) by maintaining the gain of the AGC amplifier, which is disposed at the front end of the channel extracting the target signal, at a high level when a small amount of signals is input. However, if the gain of the AGC amplifier, which is disposed at the front end of the channel extracting the target signal, is maintained at the high level, signal saturation may easily occur due to the out-of-band signals of the channel filter.

Accordingly, when the AGC amplifiers having the above-described response characteristic are provided in the AGC devices of the present invention, it is necessary to adjust the gain of the AGC amplifier disposed at the front end of the channel filter such that signal saturation does not occur when a small amount of signals is input. The control voltage of the AGC control section for each AGC amplifier is above 0.5.

In addition, when a large amount of signals is input, the gain of the AGC amplifier disposed at the front end of the channel filter must be minimized and gain control is carried out by means of the AGC amplifier disposed at the rear end of the channel filter in order to raise the signal level, which has been dropped by means of the AGC amplifier disposed at the front end of the channel filter. The control voltage of the AGC control section for each AGC amplifier is below 0.5.

A non-sensitive area against the control voltage of the AGC control section is formed at a front portion or a rear portion of the channel filter extracting the target signal. Accordingly, the response characteristic of the AGC device according to the present invention may be lower than the AGC devices illustrated in FIGS. 1, 9, 15, and 16. However, the AGC device using the gain characteristics of FIGS. 17 and 18 can maintain a superior NF while preventing signal saturation at the front portion of the channel filter.

Hereinafter, a description will be given for another preferred embodiment of the present invention, in which a reference value 'Ref1' is updated.

More specifically, in the AGC devices illustrated in FIGS. 1, 9, 15, and 16, the attack coefficient and the release coefficient, which are multiplied by the input signals from the AGC control section a 23 and the AGC control section b 25, are set to '0' (attack coefficient=release coefficient=0). When quality information of a received signal can be obtained from a signal demodulation section connected to the rear end of the automatic gain control device, it is necessary to prevent signal receiving performance from deterioration caused by the signal distortion and inferior SNR (signal to noise ratio). In addition, it is necessary to update the reference value 'Ref1' output from the reference value register 21 and subtracted from the output signal of the AGC detector a 14, or AGC detector b 17 using the subtractor 22 or subtractor 24 based on obtained quality information and to perform a level distribution control with respect to each AGC amplifier.

In AGC devices for controlling the gain of the AGC amplifier only based on communication quality, the AGC device according this embodiment of the present invention can prevent signal saturation from being created at the front end of the channel filter caused by the out-of-band signals of the channel filter extracting the target signal.

As described above, the AGC device according to the present invention includes a first variable gain amplifier means disposed at the front end of the channel filter extracting the target signal, and second and third variable gain amplifier means disposed at the rear end of the channel filter. In addition, a control signal selector means is provided to select any one from control signals generated by first and second control signal generator means in order to control the first variable gain amplifier means, in such a manner that the first variable gain amplifier means disposed at the front end of the filter can be controlled based on variation of the signal input into the channel filter or variation of the signal output from the filter. Accordingly, out-of-band signals of the filter have no influence on a gain control for the in-band signal of the filter.

Therefore, the AGC device of the present invention can properly carry out the automatic gain control in accordance with variations of the out-of-band signals of the channel filter extracting the target signal and can effectively utilize a limited dynamic range while preventing signal saturation at the front end of the filter.

In addition, when the control signal output from the second control signal generator means is selected as the control signal for the first variable gain amplifier means, the reference information copier means copies control information of the second control signal generator means into the first control signal generator means, such that the first control signal generator means suppresses its operations of controlling output signals of the first variable gain amplifier means, which is not controlled from the first control signal generator means. For example, even when a predetermined target level of the first control signal generator means is different from output signals of the first variable gain amplifier means, the control signal of the first control signal generator means can be approximated to that of the second control signal generator means. That is, there is no significant difference between the control signal of the first control signal generator means and the original output.

Accordingly, it is possible to directly switch a control signal for controlling the first variable amplifier means from the control signal output from the second control signal generator means to the control signal output from the first control signal generator means as occasion demands. Further, even if a response characteristic of the automatic gain control device with respect to variations of input signals is not excessively rapid, response compliance to the variations of the input signals can be improved, and disturbances of in-band signals of the filter due to out-band signals of the filter can be reduced. In addition, there is no need that response characteristic of the automatic gain control device is unnecessarily rapid in order to cover a control delay. Furthermore, because response compliance is improved even if the response characteristic is slow, a signal distortion which occurs until a rapid response characteristic is converged according to signal variations can be suppressed.

In addition, the second and third variable gain amplifier means are disposed at both sides of the rear end of the filter, and the third variable gain amplifier means outputs the signal as an output signal of the automatic gain control device. When the first variable gain amplifier means disposed at the front end of the channel filter is controlled based on variations of the signal output from the channel filter by using the second control signal generator means, control information of the second control signal generator means is copied in the third control signal generator means, and the gain control for the third variable gain amplifier means is carried out in accordance with a response speed of the second control signal generator means. Therefore, the third control signal generator means is prevented from controlling unnecessarily rapidly, and the automatic gain control device may output the signal without occurring signal distortion.

Accordingly, when the variation of the signal at the front end of the channel filter is very small, the response speed of the AGC amplifier disposed at the rear end of the channel filter becomes slow, such that the target signal is prevented from being distorted due to a rapid AGS response.

In addition, when quality information of a received signal is acquired from a signal demodulation section connected to a rear end of the AGC device, and when the first control signal generator means generates the control signal based on a level of an input signal, a reference value, which is compared with the level of the input signal and is varied depending on a status of quality information by means of a reference value change means, such that it is possible to balance the influence of the out-of-band signal and the in-band signal of the filter when gain control is carried out with respect to the in-band signal of the filter.

Furthermore, the AGC device of the present invention has a gain distribution adjustor means. The gain distribution adjustor means adjusts the gain distribution in a front end circuit and a rear end circuit of the filter by comparing levels of the out-of-band signal and the in-band signal of the filter with each other, thereby properly determining the gain distribution in front and rear portions of the filter.

Accordingly, the AGC device of the present invention can effectively utilize a limited dynamic range and can prevent the SNR from deterioration caused by an inferior NF (noise figure) while preventing signal saturation at the front end of the channel filter. Accordingly, an optimum signal may be output from the AGC device.

In addition, the AGC device of the present invention has a signal strength calculator means in order to measure a level of the target signal based on the control signal generated from each control signal generator means. Therefore, the AGC device can easily measure the level of the target signal based on the control signal generated from each control signal generator means.

Therefore, the AGC device of the present invention can output the optimum signal having an optimum level regardless of the statuses of the out-of-band signal and the in-band signal of the filter.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. An automatic gain control device comprising:
   a first variable gain amplifier for amplifying an input signal;
   a filter for limiting a band of an output signal of the first variable gain amplifier;
   a second variable gain amplifier for amplifying an output signal of the filter;
   a third variable gain amplifier for amplifying and externally outputting the output signal of the filter;
   a first control signal generator for generating a first control signal to control a level of the output signal of the first variable gain amplifier to a predetermined level;
   a second control signal generator for generating a second control signal to control a level of an output signal of the second variable gain amplifier to a predetermined level and outputting the second control signal to the second variable gain amplifier;
   a third control signal generator, with a response characteristic that is faster than that of the second control signal generator, for generating a third control signal for controlling a level of an output signal of the third variable gain amplifier to a predetermined level and outputting the third control signal to the third variable gain amplifier;
   a control signal selector for selecting one of the first and second control signals generated from the first and second control signal generators and outputting the selected control signal to the first variable gain amplifier; and
   a reference information copier for copying control information of the second control signal generator into the first control signal generator when the control signal output from the second control signal generator is selected as the control signal for the first variable gain amplifier.

2. The automatic gain control device as claimed in claim 1, further comprising a control information copier for copying control information of the second control signal generator into the third control signal generator, when the control signal output from the second control signal generator is selected as the control signal for the first variable gain amplifier.

3. The automatic gain control device as claimed in claim 2, wherein the control information copier copies the control information of the second control signal generator into the third control signal generator when a variation value of the first control signal generated from the first control signal generator per a unit time is less than a predetermined value.

4. The automatic gain control device as claimed in claim 1, wherein the control signal selector compares the first control signal output from the first control signal generator with the second control signal output from the second control signal generator, and simultaneously selects one of the first and second control signals, which is capable of lowering a gain of the first variable gain amplifier, to output the selected signal to the first variable gain amplifier.

5. The automatic gain control device as claimed in claim 1, further comprising a reference value changer for changing a reference value, which is compared with a level of an input signal, depending on a status of quality information when quality information of a received signal is acquired from a signal demodulation section connected to a rear end of the automatic gain control device, wherein the first control signal generator generates the first control signal based on the level of the input signal.

6. The automatic gain control device as claimed in claim 5, wherein the reference value changer changes the reference value by comparing a level of the first control signal generated from the first control signal generator with a level of the second control signal generated from the second control signal generator, and by comparing a level of a received in-band signal with a predetermined value.

7. The automatic gain control device as claimed in claim 1, further comprising a gain distribution adjuster for adjusting a gain distribution in a front end circuit and a rear end circuit of the filter, based on comparison of a level of an out-of-band signal of the filter with a level of an in-band signal of the filter.

8. The automatic gain control device as claimed in claim 1, further comprising a signal strength calculator for determining a control voltage V1 as a strength of an in-band signal of the filter when a control voltage V3 is at least equal to the control voltage V1, and determining a calculated value V, which is expressed by:

$$V=V1+(G3(V1)/G(V1))(V1-V3),$$

as the strength of the in-band signal of the filter when the control voltage V3 is less than the control voltage V1, wherein the control voltage V3 is the first control signal generated from the first control signal generator, the control voltage V1 is the second control signal generated from the second control signal generator, G(V1) is an overall gain characteristic with respect to the control voltage V1, and G3(V1) is a gain characteristic of a front circuit of the filter with respect to the control voltage V1.

9. An automatic gain control device comprising:
first variable gain amplifier for amplifying an input signal;
a filter for limiting a band of an output signal from the first variable gain amplifier;
second variable gain amplifier for amplifying and externally outputting an output signal of the filter;
first control signal generator for generating a first control signal to control a level of the output signal of the first variable gain amplifier to a predetermined level;
second control signal generator for generating a second control signal to control a level of an output signal of the second variable gain amplifier to a predetermined level and outputting the second control signal to the second variable gain amplifier;

control signal selector for selecting one of the first and second control signals output from the first and second control signal generators and outputting the selected control signal to the first variable gain amplifier; and reference information copier for copying control information of the second control signal generator into the first control signal generator, when the control signal output from the second control signal generator is selected as the control signal for the first variable gain amplifier.

10. The automatic gain control device as claimed in claim 9, wherein the control signal selector compares the first control signal output from the first control signal generator with the second control signal output from the second control signal generator, and simultaneously selects one of the first and second control signals, which is capable of lowering a gain of the first variable gain amplifier, to output the selected signal to the first variable gain amplifier.

11. The automatic gain control device as claimed in claim 9, further comprising a reference value changer for changing a reference value, which is compared with a level of an input signal, depending on a status of quality information when quality information of a received signal is acquired from a signal demodulation section connected to a rear end of the automatic gain control device, wherein the first control signal generator generates the first control signal based on the level of the input signal.

12. The automatic gain control device as claimed in claim 11, wherein the reference value changer changes the reference value by comparing a level of the first control signal generated from the first control signal generator with a level of the second control signal generated from the second control signal generator, and by comparing a level of a received in-band signal with a predetermined value.

13. The automatic gain control device as claimed in claim 9, further comprising a gain distribution adjuster for adjusting a gain distribution in a front end circuit and a rear end circuit of the filter, based on comparison of a level of an out-of-band signal of the filter with a level of an in-band signal of the filter.

14. The automatic gain control device as claimed in claim 9, further comprising a signal strength calculator for determining a control voltage V1 as a strength of an in-band signal of the filter when a control voltage V3 is at least equal to the control voltage V1, and determining a calculated value V, which is expressed by:

$$V=V1+(G3(V1)/G(V1))(V1-V3),$$

as the strength of the in-band signal of the filter when the control voltage V3 is less than the control voltage V1, wherein the control voltage V3 is the first control signal generated from the first control signal generator, the control voltage V1 is the second control signal generated from the second control signal generator, G(V1) is an overall gain characteristic with respect to the control voltage V1, and G3(V1) is a gain characteristic of a front circuit of the filter with respect to the control voltage V1.

* * * * *